(12) United States Patent
Yoshibayashi

(10) Patent No.: US 8,343,365 B2
(45) Date of Patent: Jan. 1, 2013

(54) METHOD FOR PRODUCING COLOR FILTER

(75) Inventor: Mitsuji Yoshibayashi, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 858 days.

(21) Appl. No.: 11/779,212

(22) Filed: Jul. 17, 2007

(65) Prior Publication Data
US 2008/0017607 A1  Jan. 24, 2008

(30) Foreign Application Priority Data

Jul. 19, 2006 (JP) .................................. 2006-196622
Dec. 22, 2006 (JP) .................................. 2006-346108

(51) Int. Cl.
*B29D 11/00* (2006.01)
*H01L 21/00* (2006.01)

(52) U.S. Cl. .................. 216/24; 216/2; 216/23; 216/37; 216/38; 216/41; 216/58; 216/83; 438/65; 438/66; 438/70

(58) Field of Classification Search .................... 216/23, 216/38, 50, 2, 24, 37, 41, 58, 83; 438/65, 438/66, 70
See application file for complete search history.

(56) References Cited

U.S. PATENT DOCUMENTS

| | | | |
|---|---|---|---|
| 4,182,647 A * | 1/1980 | Yoshihara et al. | 430/314 |
| 4,534,620 A * | 8/1985 | Gale et al. | 359/582 |
| 4,777,117 A | 10/1988 | Murata et al. | |
| 5,059,500 A * | 10/1991 | Needham et al. | 430/7 |
| 5,140,396 A | 8/1992 | Needham et al. | |
| 5,510,215 A * | 4/1996 | Prince et al. | 430/7 |
| 5,677,202 A * | 10/1997 | Hawkins et al. | 438/70 |
| 5,689,318 A * | 11/1997 | Matsuyama et al. | 349/106 |
| 6,720,119 B2 * | 4/2004 | Ohtsu et al. | 430/7 |
| 6,866,972 B2 * | 3/2005 | Ishino | 430/7 |

(Continued)

FOREIGN PATENT DOCUMENTS

| | | |
|---|---|---|
| JP | 55-146406 A | 11/1980 |
| JP | 61-041102 A | 2/1986 |
| JP | 5-323113 A | 12/1993 |

(Continued)

OTHER PUBLICATIONS

Communication, dated Sep. 24, 2012, issued in corresponding EP Application No. 07014051.2, 5 pages.

*Primary Examiner* — Nadine Norton
*Assistant Examiner* — Christopher Remavege
(74) *Attorney, Agent, or Firm* — Sughrue Mion, PLLC

(57) ABSTRACT

The invention provides a color filter producing method that is based on dry etching and makes it possible to produce a color filter which has fine and rectangular pixels and is excellent in flatness, and color filters produced by the method. The method is a color filter producing method of forming a first colorant-containing layer on a support, removing the first colorant-containing layer corresponding to a region where a second colorant-containing layer is to be formed by dry etching, forming the second colorant-containing layer so as to be embedded into the layer-removed region, removing the first and second colorant-containing layers corresponding to a region where a third colorant-containing layer is to be formed by dry etching, forming the third colorant-containing layer so as to be embedded into the layer-removed region, and removing the colorant-containing layers laminated on other colorant-containing layers.

4 Claims, 6 Drawing Sheets

U.S. PATENT DOCUMENTS

| | | | |
|---|---|---|---|
| 2003/0215574 A1* | 11/2003 | Ishino | 427/385.5 |
| 2004/0197681 A1* | 10/2004 | Yaung | 430/7 |
| 2004/0246351 A1* | 12/2004 | Hiatt et al. | 348/272 |
| 2009/0104545 A1* | 4/2009 | Chen et al. | 430/7 |

FOREIGN PATENT DOCUMENTS

| | | |
|---|---|---|
| JP | 10-209410 A | 8/1998 |
| JP | 2001-249218 A | 9/2001 |

* cited by examiner

METHOD FOR PRODUCING COLOR FILTER

CROSS-REFERENCE TO RELATED APPLICATION

This application claims priority under 35 USC 119 from Japanese Patent Applications No. 2006-196622 and No. 2006-346108, the disclosures of which are incorporated by reference herein.

BACKGROUND OF THE INVENTION

1. Field of the Invention

The present invention relates to a method for producing a color filter, using a dry etching process.

2. Description of the Related Art

As methods for manufacturing a color filter for use with a liquid crystal display device or a solid image pickup element, dyeing methods, printing methods, electrodeposition methods, and pigment dispersion methods are known.

In the pigment dispersion method, the color filter is produced by a photolithographic method using a colorant-containing radiation-sensitive composition prepared by dispersing a pigment in any one of various types of photosensitive compositions. The color filter produced by this method is stable with respect to light, heat and the like since the pigment is used. A high positional accuracy can be obtained in this method since patterning is performed by the photolithographic method, and accordingly, this method has widely been used as a method suitable for producing a color filter for a color display with a large screen and high fineness.

In a case in which the color filter is produced by the pigment dispersion method, the radiation-sensitive composition is first coated onto a glass substrate by using, for example, a spin coater or a roll coater and then dried, to thereby form a coating film. Then, colored pixels are obtained by pattern-exposing and developing the thus-formed coating film. The color filter can be obtained by repeating such an operation as described above for each of the different colors.

As for the pigment dispersion method, a method which uses a negative photosensitive composition comprising an alkali-soluble resin together with a photopolymerizable monomer and a photopolymerization initiator is proposed in each of, for example, Japanese Patent Application Laid-Open (JP-A) Nos. 2-181704, 2-199403, 5-273411 and 7-140654.

In recent years, it has been desired that color filters for solid image pickup elements be made minuter and finer, and techniques using a dye have been suggested (see, for example, JP-A No. 6-75375). However, curable compositions which contain a dye have a problem in that various performances such as light resistance, heat resistance, solubility, and uniform coating property are in general poorer than in compositions which contain a pigment. Moreover, when such a curable composition is used, in particular, for the production of a color filter for a solid image pickup element, the curable composition is required to provide a film thickness of 1.5 μm or less; therefore, it is necessary to add a large amount of a colorant into the curable composition. This causes a problem in that the pattern-formability of the composition is remarkably low for the following reasons: the adhesion between the film and the substrate becomes insufficient; a sufficient curability cannot be obtained; the dye is missing in the light exposure region; and other defects are caused.

In liquid crystal display devices and solid image pickup elements, reduction in the pixel size thereof has been advancing. Thus, it has become necessary to decrease the size of color filters as well. Reduction in the size of solid image pickup elements has been particularly remarkable, and thus, it has been necessary to use a technique providing a high resolution below 2.0 μm. Thus, in conventional photolithographic methods, the resolution thereof has been approaching a limit.

Apart from the above-mentioned color filter producing method using photolithography, a dry etching process has been hitherto known as a process effective for forming a thinner and finer pattern. The dry etching process has been hitherto adopted as a process for forming a pattern with respect to a thin film made of an evaporated colorant (see, for example, JP-A No. 55-146406). This process makes it possible to form a thin film which can have a thickness as small as ½ or less of the thickness obtained by photolithography and have spectral characteristics as good as those obtained by photolithography. Furthermore, a pattern forming process wherein photolithography is combined with a dry etching process has also been proposed (see, for example, JP-A No. 2001-249218).

However, in the formation of a thin film by evaporation (vapor deposition), an evaporating device is unavoidably polluted. Thus, a large burden is imposed on the production of color filters. Moreover, their pixels are made only of a pigment or dye. For this reason, the adhesion of the pixels to an underlying flattening layer or an upper layer is bad, and this is one of the reasons that the yield does not rise.

Moreover, the color filter producing method based on dry etching has a problem in that when a second colorant-containing layer is formed and etched, it is difficult to simultaneously remove the coloring material of the second layer applied on the first layer and the coloring material of the second layer coated in a region where the first layer has been removed. In the case of separately removing the coloring material of the second layer applied on the first layer and the coloring material of the second layer coated in the region where the first layer has been removed, there arise problems in that the number of steps increases and costs increase.

SUMMARY OF THE INVENTION

The present invention has been made in view of the above circumstances and provides a method for producing a color filter. A first aspect of the present invention provides a method for producing a color filter, comprising:

a first colorant-containing layer forming step (a) of forming a first colorant-containing layer over a support;

a photoresist layer forming step (b) of forming a photoresist layer on the first colorant-containing layer;

an image forming step (c) of removing the photoresist layer in a region where a second colorant-containing layer different from the first colorant-containing layer is to be formed over the support, thereby forming an image on the first colorant-containing layer;

an etching step (d) of etching the first colorant-containing layer in the region into the form of the image formed in the image forming step by dry etching;

a photoresist layer removing step (e) of removing the photoresist layer remaining after the etching step; and a second colorant-containing layer forming step (f) of forming the second colorant-containing layer at least in the region where the first colorant-containing layer has been removed.

DETAILED DESCRIPTION OF THE INVENTION

Figure 1:
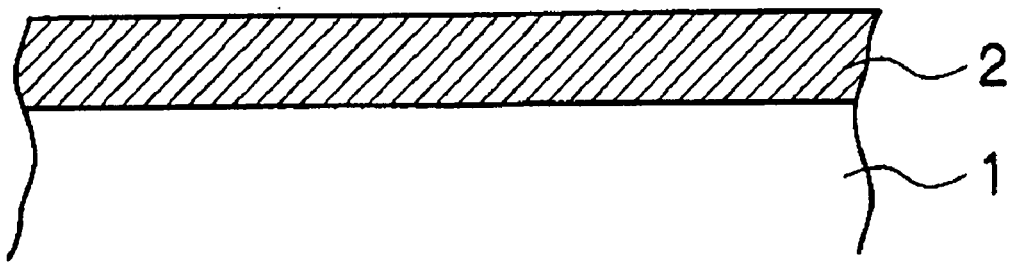
FIG. 1 is a sectional view illustrating a colorant-containing layer formed on a support.

The present invention has been made in light of the above-mentioned problems. An object thereof is to provide a color filter producing method that is based on the use of dry etching and makes it possible to produce a color filter which has fine and rectangular pixels and is excellent in flatness.

[Colorant-Containing Layer Forming Step]

The method of the invention for producing a color filter has a step (a) of forming a first colorant-containing layer over a support.

<Support>

Examples of the substrate in the present invention include soda glass, borosilicate glass and quartz glass, which are used in a liquid crystal display device or the like, those having a transparent electroconductive film adhered, and a photoelectric conversion element substrate, such as a silicon substrate, and a complementary metallic oxide semiconductor (CMOS), which are used in a solid state image sensing device or the like. There are some cases where black stripes for separating pixels are formed on the substrate. An undercoating layer may be provided, depending on necessity, on the substrate for improvement of adhesion to the upper layer, prevention of diffusion of substances, and planarization of the surface of the substrate.

<Colorant-Containing Layer>

The first colorant-containing layer in the invention is preferably made of a curable composition containing a colorant. The curable composition may be a colorant-containing photocurable composition, or a non-photosensitive, colorant-containing heat-curable composition. The colorant-containing layer can constitute at least one out of pixel species of the color filter in the invention. The colorant-containing layer in the invention is preferably made of a non-photosensitive, colorant-containing heat-curable composition from the viewpoint of spectral characteristics.

(Colorant-Containing Photocurable Composition)

The colorant-containing photocurable composition used in the invention contains at least a colorant and a photocurable component. The "photocurable component" may be a photocurable composition which is used ordinarily in photolithography and contains at least a binder resin (such as an alkali-soluble resin), a photosensitive polymerizable component (such as a photopolymerizable monomer), and a photopolymerization initiator.

-Colorant-

The colorant which can be used in the invention is not particularly limited, and various dyes or pigments known in the prior art can be used alone, or in the form of a mixture of two or more thereof.

The pigment which can be used in the invention may be selected from various inorganic pigments and organic pigments known in the prior art. Whether the pigment is inorganic or organic, it is preferable to use a pigment having an average particle diameter as small as possible in the case of considering a matter that the transmittance thereof is favorably high. Considering the handleability thereof also, the average particle diameter of the pigment is preferably from 0.01 to 0.1 µm, and more preferably from 0.01 to 0.05 µm. Examples of the inorganic pigment include metal oxides, metal complex salts, and other metal compounds. Specifically, the pigment is, for example, an oxide of a metal such as iron, cobalt, aluminum, cadmium, lead, copper, titanium, magnesium, chromium, zinc or antimony, or a complex oxide of the metal.

Examples of the organic pigment include:

C. I. Pigment Yellows 11, 24, 31, 53, 83, 93, 99, 108, 109, 110, 138, 139, 147, 150, 151, 154, 155, 167, 180, 185, and 199;

C.I. Pigment Oranges 36, 38, 43, and 71;

C. I. Pigment Reds 81, 105, 122, 149, 150, 155, 171, 175, 176, 177, 209, 220, 224, 242, 254, 255, 264, and 270;

C. I. Pigment Violets 19, 23, 32, and 39;

C. I. Pigment Blues 1, 2, 15, 15:1, 15:3, 15:6, 16, 22, 60, and 66;

C. I. Pigment Greens 7, 36, and 37;

C. I. Pigment Browns 25 and 28;

C. I. Pigment Blacks 1 and 7; and carbon black.

Preferred examples of the pigment which can be used in the invention are described below. However, in the invention, preferred examples thereof are not limited to the described examples.

C. I. Pigment Yellows 11, 24, 108, 109, 110, 138, 139, 150, 151, 154, 167, 180, and 185;

C. I. Pigment Oranges 36 and 71;

C.I. Pigment Reds 122, 150, 171, 175, 177, 209, 224, 242, 254, 255, and 264;

C. I. Pigment Violets 19, 23, and 32;

C. I. Pigment Blues 15:1, 15:3, 15:6, 16, 22, 60, and 66; and

C. I. Pigment Black 1.

These organic pigments may be used alone or in combination of two or more thereof. The use of the combination makes it possible to raise the color purity of the colorant-containing layer. Specific examples of the combination are described below. Examples of a red pigment that can be used include a single pigment selected from an anthraquinone pigment, a perylene pigment, and a diketopyrrolopyrrole pigment; and a mixture of one or more selected therefrom with a disazo yellow pigment, an isoindoline yellow pigment, a quinophthaline yellow pigment, or a perylene red pigment. For example, the anthraquinone pigment may be C. I. Pigment Red 177, the perylene pigment may be C. I. Pigment Red 155 or C. I. Pigment Red 224, and the diketopyrrolopyrrole pigment may be C. I. Pigment Red 254. From the viewpoint of color reproducibility, a combination thereof with C. I. Pigment Yellow 139 is preferable. The ratio by mass of the red pigment to the yellow pigment is preferably from 100:5 to 100:75. When the ratio is set into this range, the light transmissivity can be controlled into a low value to raise the color purity. The ratio by mass is more preferably from 100:10 to 100:50.

Examples of a green pigment that can be used include a halogenated phthalocyanine pigment alone; and a mixture of this pigment with one or more selected from a disazo yellow pigment, a quinophthalone yellow pigment, an azomethine yellow pigment and an isoindoline yellow pigment. Such examples include a mixture of C. I. Pigment Green 7, 36 or 37 with C. I. Pigment Yellow 83, 138, 139, 150, 180 or 185. The ratio by mass of the green pigment to the yellow pigment is preferably from 100:5 to 100:150.

Examples of a blue pigment that can be used include a phthalocyanine pigment alone; and a mixture of this pigment with a dioxazine violet pigment. For example, a mixture of C. I. Pigment Blue 15:6 with C. I. Pigment Violet 23 is preferable. The ratio by mass of the blue pigment to the violet pigment is preferably from 100:0 to 100:30.

When the colorant is a dye in the invention, the dye is evenly dissolved into other components so that a homogeneous photocurable colorant-containing resin composition can be obtained.

The dye that can be used as the colorant which constitutes the composition in the invention is not particularly limited, and may be a dye which has been hitherto known as a dye for a color filter. Examples thereof include colorants disclosed in JP-A Nos. 64-90403, 64-91102, 1-94301, and 6-11614, Japanese Patent No. 2592207, U.S. Pat. Nos. 4,808,501, 5,667,920, and 5,059,500, and JP-A Nos. 5-333207, 6-35183, 6-51115, 6-194828, 8-211599, 4-249549, 10-123316, 11-302283, 7-286107, 2001-4823, 8-15522, 8-29771, 8-146215, 11-343437, 8-62416, 2002-14220, 2002-14221, 2002-14222, 2002-14223, 8-302224, 8-73758, 8-179120, and 8-151531.

A dye having, as its chemical structure, the following can be used: a pyrazoleazo, anilinoazo, triphenylmethane, anthraquinone, anthrapyridone, benzilidene, oxonol, pyrazolotriazoleazo, pyrridoneazo, cyanine, phenothiazine, pyrrolopyrazoleazomethine, xanthene, phthalocyanine, benzopyran or indigo structure, or some other structure.

In the case of a resist system about which development with water or alkali is conducted, an acidic dye and/or a derivative thereof may be preferably used in order to remove completely a binder and/or the dye in a portion which is to be completely removed by development. Additionally, it is possible to use effectively a direct dye, a basic dye, a mordant dye, an acidic mordant dye, an azoic dye, a disperse dye, an oil-soluble dye, a food dye, and/or a derivative thereof.

The acidic dye is not particularly limited as long as the dye has an acid group such as a sulfonic acid or carboxylic acid group. The acidic dye is selected, considering all performances to be required, such as solubility in an organic solvent or a developing solution, salt-formability based on combination with a basic compound, absorbance, interaction with the other components in the composition, light resistance, and heat resistance. Specific examples thereof include the following: acid alizarin violet N; acid blacks 1, 2, 24, and 48; acid blues 1, 7, 9, 15, 18, 23, 25, 27, 29, 40, 45, 62, 70, 74, 80, 83, 86, 87, 90, 92, 103, 112, 113, 120, 129, 138, 147, 158, 171, 182, 192, 243, and 324:1; acid chrome violet K; acid Fuchsin; acid greens 1, 3, 5, 9, 16, 25, 27, and 50; acid oranges 6, 7, 8, 10, 12, 50, 51, 52, 56, 63, 74, and 95; acid reds 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274; acid violets 6B, 7, 9, 17, and 19; acid yellows 1, 3, 7, 9, 11, 17, 23, 25, 29, 34, 36, 42, 54, 72, 73, 76, 79, 98, 99, 111, 112, 114, 116, 184, and 243; Food Yellow 3; and derivatives of these dyes; however, the acidic dye is not limited thereto.

Out of these, the following are preferable as the acidic dye: acid black 24; acid blues 23, 25, 29, 62, 80, 86, 87, 92, 138, 158, 182, 243, and 324; acid oranges 8, 51, 56, 63, and 74; acid reds 1, 4, 8, 34, 37, 42, 52, 57, 80, 97, 114, 143, 145, 151, 183, and 217; acid violet 7; acid yellows 17, 25, 29, 34, 42, 72, 76, 99, 111, 112, 114, 116, 184, and 243; acid green 25; and derivatives of these dyes. Besides the above, preferable are also azo, xanthene, and phthalocyanine based acidic dyes; and C. I. Solvent Blues 44 and 38, C. I. Solvent Orange 45, Rhodamine B, Rhodamine 110 and other acidic dyes, and derivatives of these dyes.

The content by percentage of the colorant in all solid contents in the colorant-containing photocurable composition in the invention is not particularly limited, and is preferably from 30 to 60% by mass. When the content is set to 30% or more, a chromaticity suitable for a color filter can be obtained. When the content is set to 60% or less, the composition can be sufficiently photocured so that a fall in the strength of the resultant film can be restrained. Furthermore, when the composition is developed with an alkali, the development latitude thereof can be restrained from becoming narrow.

In the invention, a pigment dispersant or a surfactant known in the prior art can be added to the composition in order to improve the dispersibility of the pigment. As the dispersant, various compounds can be used. Examples thereof include phthalocyanine derivatives (such as commercially available products EFKA-745 manufactured by Efka Co.) and SOLSPERSE [transliteration] 5000 manufactured by Nippon Roobrisol Kabushiki Kaisha [transliteration]; cationic surfactants, such as an organosiloxane polymer (trade name: KP341, manufactured by Shin-Etsu Chemical Co., Ltd.), a (meth)acrylic (co)polymer (trade name: POLYFLOW [transliteration] Nos. 75, 90, and 95, manufactured by Kyoei Chemical Co., Ltd.), and a surfactant named W001 (manufactured by Yusho Kabushiki Kaisha [transliteration]); nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyoxyethylene glycol distearate, and sorbitan aliphatic acid esters; anionic surfactants such as surfactants named W004, W005, and W017 (manufactured by Yusho Kabushiki Kaisha [transliteration]); polymeric dispersants named EFKA-46, EFKA-47, EFKA-47EA, EFKA POLYMER 100, EFKA POLYMER 400, EFKA POLYMER 401, EFKA POLYMER 450 (manufactured by Morishita Sangyo Kabushiki Kaisha [transliteration]), and named DISPERSE AIDs [transliteration] 6, 8, 15, and 9100 (manufactured by San Nopco. Ltd.); various SOLSPERSE [transliteration] dispersants named SOLSPERSEs 3000, 5000, 9000, 12000, 13240, 13940, 17000, 24000, 26000, and 28000 (each manufactured by Nippon Roobrisol Kabushiki Kaisha [transliteration]); other dispersants named ADECAPLRONICs [transliteration] L31, F38, L42, L44, L61, L64, F68, L72, P95, F77, P84, F87, P94, L101, P103, F108, L121 and P-123 (each manufactured by Asahi Denka Kogyo K.K.), and named ISONET [transliteration] S-20 (manufactured by Sanyo Chemical Industries, Ltd.).

-Photocurable Component-

The "photocurable component" is a photocurable composition that is ordinarily used in photolithography, and may be a composition composed of a binder resin (such as an alkali soluble resin), a photosensitive polymerizable component (such as a photopolymerizable monomer), a photopolymerization initiator, and/or the like.

-Alkali Soluble Resin-

As the binder resin, an alkali soluble resin is preferable. The alkali soluble resin is preferably an acrylic resin having, in the molecule thereof, a polyoxyalkylene group and/or hydroxyethyl methacrylate (HEMA) in order to set a change rate of the line width of the coating film after the film is developed to the used exposure intensity to $7.5 \times 10^{-5}$ μm·m$^2$/J or less. About the acrylic resin, the mass-average molecular weight in terms of polystyrene is preferably from 5,000 to 50,000, more preferably from 6,000 to 30,000, and most preferably from 8,000 to 20,000. The content by mol percentage of the polyoxyalkylene group is preferably from 0.5 to 18% by mol, more preferably from 0.8 to 15% by mol, and most preferably from 1 to 10% by mol. The polyoxyalkylene group is preferably a polyethylene oxide group, and the addition mol number n $[(EO)_n]$ thereof is preferably from 2 to 25, more preferably from 2 to 15, and most preferably from 5 to 12. The content by mol percentage of the hydroxyethyl methacrylate is from 10 to 30% by mol, more preferably from 15 to 25% by mol.

An example of the acrylic resin having, in the molecule thereof, a polyoxyalkylene group is the following alkali soluble resin A: An alkali soluble resin A comprising: at least one acid component (i) selected from maleic anhydride (MAA), acrylic acid (AA), methacrylic acid (MA), and fumaric acid (FA); an alkylpolyoxyethylene (meth)acrylate (ii); and benzyl(meth)acrylate (iii).

In the alkali soluble resin A, the ratio by mole of the acid component monomer (i) to the alkylpolyoxyethylene (meth) acrylate (ii), which is represented by $Acr(EO)_n$:$CH_3(OC_2H_4)_nOCOC(R)=CH_2$ wherein R is H or $CH_3$, to benzyl (meth)acrylate (iii), which may be abbreviated to BzMA, is preferably from 15/1/50 to 30/20/84, more preferably from 17/2/60 to 25/15/80. The mass-average molecular weight (Mw) of the alkali soluble resin A, which is measured by GPC, is preferably from 5,000 to 50,000, more preferably 6,000 to 30,000 in terms of polystyrene.

When the ratio by mol of the acid component monomer (i) is the lower limit of the above-mentioned range or more, the alkali solubility of the resin A is improved. When the ratio by mol is the upper limit of the range or less, the solubility into a solvent is improved. When the ratio by mol of the alkylpolyoxyethylene (meth)acrylate (ii), which is represented by Acr $(EO)_n$:$CH_3(OC_2H_4)_nOCOC(R)=CH_2$ wherein R is H or $CH_3$, is the lower limit of the range or more, the spread of a coating solution of the photosensitive colorant-containing resin composition becomes sufficient so that the invention tends to be able to be effectively attained. When the ratio by mol is the upper limit of the range or less, the dispersibility of the colorant tends to be favorably improved. When the ratio by mole of benzyl(meth)acrylate (iii), which may be abbreviated to BzMA, is the lower limit of the range or more, the dispersion stability of the colorant or the solubility thereof in the composition tends to be favorably improved. When the ratio by mol is the upper limit of the range or less, the developability of the coating film with an alkali is favorably improved.

The number n of recurring units in the polyoxyethylene $[(EO)_n]$ of the alkylpolyoxyethylene (meth)acrylate (ii), which is represented by $Acr(EO)_n$:$CH_3(OC_2H_4)_nOCOC(R)=CH_2$ wherein R is H or $CH_3$, is from 2 to 25, preferably from 2 to 15, more preferably from 5 to 12. When the number n of the recurring units is the lower limit of the range or more, the generation of development residues is easily restrained after the composition is developed with an alkali developing solution. On the other hand, when the number n is the upper limit of the range or less, the fluidity of the composition as a coating solution is improved so that the generation of coating unevenness is restrained. Thus, the evenness of the coating film thickness and the solution-saving performance of the composition tend to be favorably improved.

The acrylic resin having, in the molecule thereof, hydroxyethyl methacrylate (HEMA) may be a compound wherein the alkylpolyoxyethylene methacrylate (ii) of the alkali soluble resin (A) is substituted with hydroxyethyl methacrylate (HEMA). The acrylic polymer having, in the molecule thereof, a polyoxyalkylene group and hydroxyethyl methacrylate (HEMA) may be a compound wherein the alkali soluble resin A is further copolymerized with hydroxyethyl methacrylate (HEMA).

The content by percentage of the alkali soluble resin in the photocurable composition in the invention is preferably from 0.5 to 15% by mass, more preferably from 1.0 to 12% by mass. When the content of the alkali soluble resin is 0.5% by mass or more, the composition is more speedily developed so that production costs can be decreased. If the content is 15% by mass or less, a good pattern profile can be obtained.

~Photopolymerizable component~

In general polymerizable monomers are used as the photopolymerizable component in the invention. As the monomer, compounds having at least one addition-polymerizable ethylenically unsaturated group and a boiling point of 100° C. or more under normal pressure are preferable. Examples of the monomer include monofunctional acrylates or methacrylates such as a polyethylene glycol mono(meth)acrylate, polypropylene glycol mono(meth)acrylate and phenoxyethyl (meth)acrylate; polyethylene glycol di(meth)acrylate, trimethylolethanetri(meth)acrylate, neopentyl glycol di(meth) acrylate, pentaerythritol tri(meth)acrylate, pentaerythritol tetra(meth)acrylate, dipentaerythritol penta(meth)acrylate, dipentaerythritol hexa(meth)acrylate, hexanediol (meth) acrylate, trimethylolpropanetris(acryloyloxypropyl) ether, tris(acryloyloxyethyl)isocyanurate, compounds obtained by adding an ethylene oxide or propylene oxide to polyfunctional alcohols such as glycerin and trimethylolethane, followed by (meth)acrylating, urethaneacrylates as described in each publication of JP-B No. 48-41708, JP-B No. 50-6034 and JP-A No. 51-37193, polyester acrylates described in each publication of JP-A No. 48-64183, JP-B No. 49-43191 and JP-B No. 52-30490 and polyfunctional acrylates or methacrylates such as epoxyacrylates which are reaction products of epoxy resins and (meth)acrylates and mixtures of these compounds. Further, those introduced as photocurable monomers and oligomers in J. Japan Adhesive Association, Vol. 20, No. 7, page 300 to page 308 are exemplified.

The polymerizable monomer is also preferably a monomer having, in the molecule thereof, a polyoxyalkylene group in order to set a change rate of the line width of the above-mentioned coating film after the film is developed to the used exposure intensity to $7.5 \times 10^{-5}$ μm·m$^2$/J or less. Examples of such a polymerizable monomer include the following:

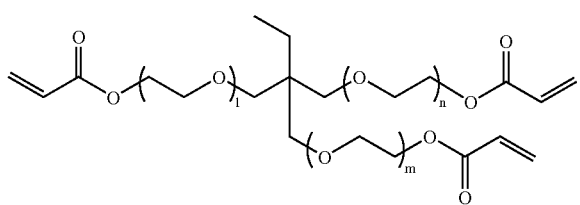

EO = l + m + n ≒ 6

NK ESTER A-TMP-6EO (manufactured by Shin-Nakamura Chemical Co., Ltd.)

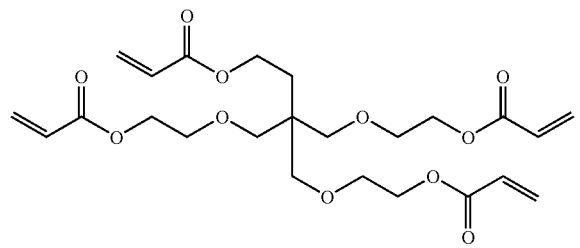 [SMILES: C=CC(=O)OCCOCC(CCOC(=O)C=C)(COCCOC(=O)C=C)COCCOC(=O)C=C]

KAYARAD RP-1040 (manufactured by Nippon Kayaku Co., Ltd.)

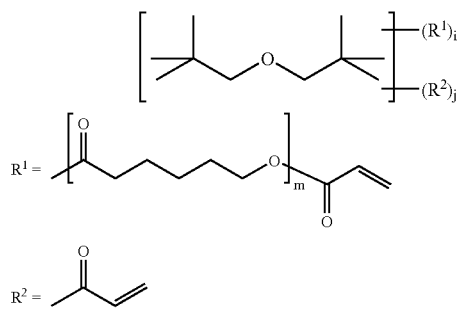

m: 1, i: 3, j: 3

KAYARAD DPCA-30 (manufactured by Nippon Kayaku Co., Ltd.)

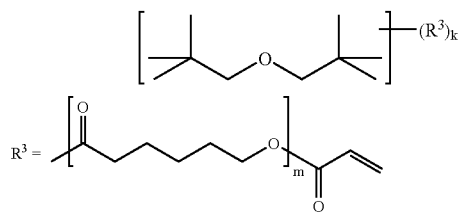

m: 1, k: 6

KAYARAD DPCA-50 (manufactured by Nippon Kayaku Co., Ltd.)

The content by percentage of the polymerizable monomer in the photocurable composition is preferably from 0.1 to 90% by mass, more preferably from 1.0 to 80% by mass, and still more preferably from 2.0 to 70% by mass, with respect to the solid contents therein.

-Photopolymerization Initiator-

The photopolymerization initiator is not particularly limited as long as the initiator is an initiator capable of polymerizing the above-mentioned polymerizable monomer (and the above-mentioned alkali soluble resin as the case may be). The initiator preferably contains at least one selected from the group consisting of a halomethyl-s-triazine compound, an oxime compound, and an α-aminoketone compound from the viewpoint of polymerization characteristics, initiation efficiency, absorbed wavelength, availability, costs and others.

Examples of the trihalomethyl-s-triazine compound photopolymerization initiator include vinyl-halomethyl-s-triazine compounds as disclosed in Japanese Patent Application Publication (JP-B) No. 59-1281, 2-(naphtho-1-yl)-4,6-bis-halomethyl-s-triazine compounds and 4-(p-aminophenyl)-2,6-bis-halomethyl-s-triazine compounds as disclosed in Japanese Patent Application Laid-Open (JP-A) No. 53-133428, and the like.

Other examples of photopolymerization initiator include TAZ series manufactured by Midori Kagaku Co., Ltd., including TAZ-107, TAZ-110, TAZ-104, TAZ-109, TAZ-140, TAZ-204, TAZ-113, TAZ-123, TAZ-104, and the like Examples of the photopolymerization initiator of the α-aminoketone compound include IRGACURE series manufactured by Ciba-Geigy Japan Limited Specialty Chemicals Inc., such as IRGACUREs 907 and 369; and 2-methyl-1-phenyl-2-morpholinopropane-1-one, 2-methyl-1-[4-(hexyl) phenyl]-2-morpholinopropane-1-one, and 2-ethyl-2-dimethylamino-1-(4-morpholinophenyl)-butanone-1.

The photopolymerization initiator of the oxime compound is not particularly limited, and examples thereof include 1-[4-(phenylthio)phenyl]-1,2-octanedione=2-(O-benzoyloxime), 1-(4-methylsulfanylphenyl)-1,2-butanedione=2-(O-acetyloxime), 1-(4-methylsulfanyl-phenyl)-1-butanone=O-acetyloxime, hydroxyimino-(4-methylsulfanyl-phenyl)-ethyl acetate-O-acetate, and hydroxyimino-(4-methylsulfanyl-phenyl)-ethyl acetate-O-benzoate.

These photopolymerization initiators can be used in combination with sensitizers and light stabilizers. Specific examples of the sensitizers and light stabilizers include: benzoin, benzoinmethylether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-methoxyxanthone, thioxanthone, 2,4-diethylthioxanthone, acridone, 10-butyl-2-chloroacridone, benzyl, dibenzalacetone, p-(dimethylamino)phenylstyrylketone, p-(dimethylamino)phenyl-p-methylstyrylketone, benzophenone, p-(dimethylamino)benzophenone (or Michler's ketone), p-(dimethylamino)benzophenone, benzoanthron, and the like; benzothiazole compounds and the like as disclosed in Japanese Patent Application Publication (JP-B) No. 51-48516; TINUVIN® 1130 and TINUVIN® 400 (both manufactured by Ciba Specialty Chemicals); and the like.

In addition to the above-mentioned photopolymerization initiators, commonly-known photopolymerization initiators can be used in the composition of the present invention. Specific examples thereof include vicinalpolyketolaldonyl compounds as disclosed in U.S. Pat. No. 2,367,660; α-carbonyl compounds as disclosed in U.S. Pat. Nos. 2,367,661 and 2,367,670; acyloinethers as disclosed in U.S. Pat. No. 2,448,828; aromatic acyloin compounds substituted by α-hydrocarbon groups as disclosed in U.S. Pat. No. 2,722,512; multicore quinone compounds as disclosed in U.S. Pat. Nos. 3,046,127 and 2,951,758; combinations of triarylimidazole dimers and p-aminophenylketones as disclosed in U.S. Pat.

No. 3,549,367; benzothiazole compounds and trihalomethyl-s-triazine compounds as disclosed in Japanese Patent Application Publication (JP-B) No. 51-48516, and the like.

Other examples of the known photopolymerization initiator include at least one active halogen compounds selected from halomethyloxadiazole compounds and halomethyl-s-triazine compounds, 3-aryl-substituted coumalin compounds, lophine dimer, benzophenone compounds, acetophenone compounds and derivatives thereof, a cyclopentadiene-benzene-iron complex and salts thereof, and oxime compounds other than the above-mentioned oxime compounds.

An active halogen compound such as halomethyloxadiazole can be effectively used. Examples thereof include 2-halomethyl-5-vinyl-1,3,4-oxadiazole compounds described in JP-B No. 57-6096; and 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

As the photopolymerization initiator, T series manufactured by Panchim Ltd., including T-OMS, T-BMP, T-R, and T-B (all trade names, manufactured by Panchim Ltd.); IRGACURE® series manufactured by Ciba Specialty Chemicals Inc., including IRGACURE® 651, IRGACURE® 184, IRGACURE® 500, IRGACURE® 1000, IRGACURE®149, IRGACURE® 819, and IRGACURE® 261; DAROCURE® series manufactured by Ciba Specialty Chemicals Inc., including DAROCURE® 1173; 4'-bis(diethylamino)-benzophenone, 2-benzyl-2-dimethylamino-4-morpholinobuthylophenone, 2,2-dimethoxy-2-phenylacetophenone, 2-(o-chlorphenyl)-4,5-diphenylimidazolyl dimer, 2-(o-fluorophenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, benzoinisopropylether, and the like can be usefully utilized.

The amount of the photopolymerization initiator used in the invention is preferably from 0.01 to 50% by mass, more preferably from 1 to 30% by mass thereof, and still more preferably from 1 to 20% by mass, with respect to the solid contents in the polymerizable monomer. When the amount of the photopolymerization initiator used is set to 0.01% by mass or more, the polymerization advances easily. When the amount is set to 50% by mass or less, the polymerization rate becomes small but the molecular weight becomes large so that the film strength can be made large.

Besides the above-mentioned components, a thermal polymerization inhibitor is preferably incorporated into the photocurable composition in the invention. Useful examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and 2-mercaptobenzoimidazole.

-Solvent-

Basically, the solvent that can be used, if necessary, in the photocurable composition used in the invention is not particularly limited as long as the solvent satisfies the performance of dissolving the composition and gives coating property to the composition. It is particularly preferable to select the solvent, considering its performance of dissolving the dye and the binder (the alkali soluble resin), the coating property, and safety. Examples of the solvent that can be used to prepare the photocurable composition include esters such as ethyl acetate, n-butyl acetate, isobutyl acetate, amyl formate, isoamyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate;

alkyl 3-oxypropionates such as methyl 3-oxypropionate and ethyl 3-oxypropionate; alkyl 3-alkoxypropionates such as methyl 3-methoxypropionate, ethyl 3-methoxypropionate, methyl 3-ethoxypropionate, and ethyl 3-ethoxypropionate; alkyl 2-oxypropionates such as methyl 2-oxypropionate, ethyl 2-oxypropionate, and propyl 2-oxypropionate; methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, ethylene glycol monomethyl ether acetate (methylcellosolve acetate), ethylene glycol monoethyl ether acetate (ethylcellosolve acetate), diethylene glycol monomethyl ether, diethylene glycol monoethyl ether, diethylene glycol monobutyl ether, diethylene glycol monoethyl ether acetate (ethylcarbitol acetate), diethylene glycol monobutyl ether acetate (buytlcarbitol acetate), propylene glycol methyl ether, propylene glycol methyl ether acetate, propylene glycol ethyl ether acetate, and propylene glycol propyl ether acetate; ketones such as methyl ethyl ketone, cyclohexanone, 2-heptanone, and 3-heptanone; and aromatic hydrocarbons such as toluene and xylene.

Out of these, preferred are methyl 3-ethoxypropionate, ethyl 3-ethoxypropionate, ethylene glycol monoethyl ether acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, and propylene glycol methyl ether acetate.

-Other Additives-

If necessary, various additives can be incorporated into the photocurable composition in the invention, examples of the additives including a filler, a polymeric compound other than the above-mentioned polymeric compounds, a surfactant, an adhesion promoter, an antioxidant, an ultraviolet absorbent, and an aggregation inhibitor.

Specific examples of the additives include glass, alumina, and other fillers; polyvinyl alcohol, polyacrylic acid, polyethylene glycol monoalkyl ether, polyfluoroalkyl acrylate, and other polymeric compounds other than the binder resin; nonionic, cationic and anionic surfactants; vinyltrimethoxysilane, vinyltriethoxysilane, vinyltris(2-methoxyethoxy)sialne, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, and other adhesion promoters; 2,2-thiobis(4-methyl-6-t-butylphenol), 2,6-di-t-butylphenol, and other antioxidants; 2-(3-t-butyl-5-methyl-2-hydroxyphenyl)-5-chlorobenzotriazole, alkoxybenzophenone, and other ultraviolet absorebtns; and sodium polyacryalte, and other aggregation inhibitors.

In the case of promoting the alkali-solubility of a portion to be removed by development to make the developability of the photocurable composition better, an organic carboxylic acid, preferably a low-molecular-weight organic carboxylic acid having a molecular weight of 1000 or less, may be added to the photocurable composition. Specific examples thereof include aliphatic monocarboxylic acids such as formic acid, acetic acid, propionic acid, butyric acid, valeric acid, pivalic acid, caproic acid, diethylacetic acid, enanthic acid, and caprylic acid; aliphatic dicarboxylic acids such as oxalic acid, malonic acid, succinic acid, glutaric acid, adipic acid, pimelic acid, suberic acid, azelaic acid, sebacic acid, brasylic acid, methylmalonic acid, ethylmalonic acid, dimethylmalonic acid, methylsuccinic acid, tetramethylsuccinic acid, and citraconic acid; aliphatic tricarboxylic acids such as tricarbullylic acid, aconitic acid, and camphoronic acid; aromatic monocarboxylic acids such as benzoic acid, toluic acid, cuminic acid, hemellitic acid, and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenylacetic acid, hydroatropic acid, hydrocinnamic acid, mandelic acid, phenylsuccinic acid, atropic acid, cinnamic acid, cinnamylideneacetic acid, coumaric acid, and umbelic acid.

The first colorant-containing layer forming step in the invention may include the step of applying the colorant-containing photocurable composition directly onto a support, or applying the composition over a support to interpose a different layer therebetween, and the drying the coated composition to form a coating film (a coating film forming step), the step of exposing the coating film to light (an exposing step), the step of developing the exposed coating film with an alkaline developing solution (a developing step), and the step of subjecting the coating film, which is exposed to the light and then developed, to heating treatment (a post-baking step).

In the coating film forming step, a radial ray sensitive composition layer (coating film layer) may be formed by applying the colorant-containing photocurable composition on/over a support by spin coating, cast coating, roll coating, slit coating or some other coating method, and then drying the coated composition.

In the exposing step, the coating film formed in the coating film forming step may be photocured by irradiating the coating film with a radial ray so as to be exposed to the ray. For example, light having a specified pattern is radiated through a mask. Particularly preferred examples of the radial ray used for the exposure include the g- , h- , and i-lines, and other ultraviolet lines.

In the post-baking step, heat treatment is conducted to cure the exposed coating film sufficiently. The heating temperature in the heating treatment is preferably from 100 to 300° C., more preferably from 150 to 250° C. The heating time is preferably from about 10 minutes to 1 hour, more preferably from about 5 to 30 minutes.

(Non-Photosensitive, Colorant-Containing Heat-Curable Composition)

In the invention, it is preferable to use a non-photosensitive, colorant-containing heat-curable composition to form a first colorant-containing layer. It is preferable that the non-photosensitive, colorant-containing heat-curable composition in the invention contains a colorant and a heat-curable compound and the concentration of the colorant in all solid contents therein is 50% by mass or more and less than 100% by mass.

-Colorant-

The colorant may be preferably the same described about the above-mentioned colorant-containing photocurable composition.

-Heat-Curable Compound-

The heat-curable compound for use in the invention is not particularly limited, if it is a compound that hardens by heating, and is, for example, a compound having a heat-curable functional group. Examples of the heat-curable compounds include compounds having at least one group selected from the groups consisting of epoxy, methylol, alkoxymethyl and acyloxymethyl groups.

More preferable examples of such heat-curable compounds include (a) an epoxy compound; (b) a melamine compound, a guanamine compound, a glycoluryl compound or a urea compound substituted with at least one substituent selected from among a methylol group, an alkoxymethyl group and an acyloxymethyl group; and (c) a phenol compound, a naphthol compound or a hydroxyanthrathene compound substituted with at least one substituent selected from among a methylol group, an alkoxymethyl group and an acyloxymethyl group. Among them, a multifunctional epoxy compound is particularly preferably used as a heat-curable compound in the invention.

The epoxy compound (a) may be any compound that has an epoxy group and crosslinking property, and examples thereof include a divalent glycidyl group-containing low molecular weight compound, such as bisphenol A glycidyl ether, ethylene glycol diglycidyl ether, butanediol diglycidyl ether, hexanediol diglycidyl ether, dihydroxybiphenyl diglycidyl ether, diglycidyl phthalate and N,N-diglycidylaniline, a trivalent glycidyl group-containing low molecular weight compound, such as trimethylolpropane triglycidyl ether, trimethylolphenol triglycidyl ether and Tris P-PA (trisphenol P-PA) triglycidyl ether, a tetravalent glycidyl group-containing low molecular weight compound, such as pentaerythritol tetraglycidyl ether and tetramethylolbisphenol A tetraglycidyl ether, a polyvalent glycidyl group-containing low molecular weight compound, such as dipentaerythritol pentaglycidyl ether and dipentaerythritol hexaglycidyl ether, and a glycidyl group-containing polymer compound, such as polyglycidyl (meth)acrylate and a 1,2-epoxy-4-(2-oxiranyl)cyclohexane adduct of 2,2-bis(hydroxymethyl)-1-butanol.

Examples of commercially available products thereof include alicyclic epoxy compounds as named "CEL-2021", alicyclic solid epoxy resins as named "EHPE-3150", epoxidized polybutadienes as named "PB3600", flexible alicyclic epoxy compounds as named "CEL-2081", and lactone-modified epoxy compounds as named "PCL-G" (each manufactured by Daicel Chemical Industries, Ltd.); and products as named "CELLOXIDE [transliteration] 2000", "EPOLEAD [transliteration] GT-3000", and "GT-4000" (each manufactured by Daicel Chemical Industries, Ltd.). Out of these, alicyclic solid epoxy resins are best in curability. Out of the resins, one named "EHPE-3150" is most preferred. These compounds may be used alone, or in combination of two or more thereof. The compounds may each be combined with one or more other heat-curable compounds that will be described below.

The number of a methylol group, an alkoxymethyl group and an acyloxymethyl group contained in and substituted on the compound of the category (b) is generally from 2 to 6 in the case of the melamine compound and from 2 to 4 in the case of the glycoluril compound, the guanamine compound and the urea compound, and is preferably from 5 to 6 in the case of the melamine compound and from 3 to 4 in the case of the glycoluril compound, the guanamine compound and the urea compound. Hereinafter, such melamine compound, guanamine compound, glycoluryl compound and urea compound as described in (b) may sometimes be referred to also as a methylol group-containing compound of the category (b), an alkoxymethyl group-containing compound of the category (b) or an acyloxymethyl group-containing compound of the category (b).

The methylol group-containing compound of the category (b) can be obtained by heating an alkoxymethyl group-containing compound in an alcohol in the presence of an acid catalyst, such as hydrochloric acid, sulfuric acid, nitric acid and methanesulfonic acid. The acyloxymethyl group-containing compound of the category (b) can be obtained by mixing and stirring a methylol group-containing compound with an acyl chloride in the presence of a basic catalyst.

Specific examples of the compounds of the category (b) having the aforementioned substituent are shown below. Examples of the melamine compound include hexamethylolmelamine, hexakis(methoxymethyl)melamine, a compound obtained by methoxymethylating from 1 to 5 methylol groups of hexamethylolmelamine or a mixture thereof, hexamethoxyethylmelamine, hexakis(acyloxymethyl)melamine, and a compound obtained by acyloxymethlating from 1 to 5 methylol groups of hexamethylolmelamine or a mixture thereof.

Examples of the guanamine compound include tetramethylolguanamine, tetrakis(methoxymethyl)guanamine, a compound obtained by methoxymethylating from 1 to 3 methylol groups of tetramethylolguanamine or a mixture thereof, tetrakis(methoxyethyl)guanamine, tetrakis(acyloxymethyl)guanamine, and a compound obtained by acyloxymethylating from 1 to 3 methylol groups of tetramethylolguanamine or a mixture thereof.

Examples of the glycoluril compound include tetramethylolglycoluril, tetrakis(methoxymethyl)glycoluril, a compound obtained by methoxymethylating from 1 to 3 methylol groups of tetramethylolglycoluril or a mixture thereof, and a compound obtained by acyloxymethylating from 1 to 3 methylol groups of tetramethylolglycoluril or a mixture thereof.

Examples of the urea compound include tetramethylolurea, tetrakis(methoxymethyl)urea, a compound obtained by methoxymethylating from 1 to 3 methylol groups of tetramethylolurea or a mixture thereof, and tetrakis(methoxyethyl)urea. The compounds of the category (b) may be used either each individually or in combinations of 2 or more types.

The heat-curable compound (c) above, i.e., the phenol, naphthol, or hydroxyanthracene compound substituted with at least one group selected from methylol, alkoxymethyl, and acyloxymethyl groups, prevents intermixing with the topcoat photoresist and further improves the strength of the film by thermal crosslinking in a similar manner to the heat-curable compound (b) above. Hereinafter, these compounds may be referred to collectively as compounds (c) (methylol group- , alkoxymethyl group- and acyloxymethyl group-containing compounds).

The number of the methylol, acyloxymethyl, and alkoxymethyl groups contained in the compound of the category (c) is at least two per molecule; and compounds having a skeletal phenol compound substituted at all 2- and 4-positions are preferable, from the viewpoints of thermal crosslinking efficiency and storage stability. In addition, the skeletal naphthol or hydroxyanthracene compound is also preferably a compound having substituents at all positions ortho and para to the OH group. The 3- or 5-position of the skeletal phenol compound may be unsubstituted or substituted. In addition, in the skeletal naphthol compound, the positions excluding those ortho to the OH group may be unsubstituted or substituted.

The methylol group-containing compound of the category (c) may be obtained by using a compound having a hydrogen atom at the 2- or 4-position relative to the phenolic OH group as a starting material and, then, allowing the material to react with formalin in the presence of a base catalyst such as sodium hydroxide, potassium hydroxide, ammonia or tetraalkylammonium hydroxide. The alkoxymethyl group-containing compound of the category (c) may be obtained by heating the methylol group-containing compound of the category (c) in an alcohol in the presence of an acid catalyst such as hydrochloric acid, sulfuric acid, nitric acid or methane sulfonic acid. The acyloxymethyl group-containing compound of the category (c) may be obtained by allowing the methylol group-containing compound of the category (c) to react with an acyl chloride in the presence of a base catalyst.

Examples of the skeleton compounds for the compound of the category (c) include phenol, naphthol, and hydroxyanthracene compounds having no substituent on the positions ortho- and para- to the phenolic OH, and the like; and specific examples thereof used include phenol, cresol isomers, 2,3-xylenol, 2,5-xylenol, 3,4-xylenol, 3,5-xylenol, bisphenols such as bisphenol A, 4,4'-bishydroxybiphenyl, Tris P-A (manufactured by Honshu Chemical Industry Co., Ltd.), naphthol, dihydroxynaphthalene, 2,7-dihydroxyanthracene.

As specific examples of the compound of the category (c), examples of the phenol compound include trimethylolphenol, tris(methoxymethyl)phenol, a compound obtained by methoxymethylating from 1 to 2 methylol groups of trimethylolphenol, trimethylol-3-cresol, tris(methoxymethyl)-3-cresol, a compound obtained by methoxymethylating from 1 to 2 methylol groups of trimethylol-3-cresol, a dimethylol-cresol, such as 2,6-dimethylol-4-cresol, tetramethylolbisphenol A, tetrakis(methoxymethyl)bisphenol A, a compound obtained by methoxymethlating from 1 to 3 methylol groups of tetramethylolbisphenol A, tetramethylol-4,4'-bishydroxybiphenyl, tetrakis(methoxymethyl)-4,4'-bishydroxybiphenyl, a hexamethylol compound of Tris P-PA, a hexakis(methoxymethyl) compound of Tris P-PA, a compound obtained by methoxymethylating from 1 to 5 methylol groups of a hexamethylol compound of Tris P-PA, and bis(hydroxymethyl) naphthalenediol.

Examples of the hydroxyanthracene compound include 1,6-bis(hydroxymethyl)-2,7-dihydroxyanthracene, and examples of the acyloxymethyl group-containing compound include compounds obtained by acyloxymethylating a part or all of the methylol groups of the methylol group-containing compounds.

Preferable compounds among the aforementioned compounds are trimethylol phenol, bis(hydroxymethyl)-p-cresol, tetramethylol bisphenol A, and a hexamethylol form of Tris P-PA (manufactured by Honshu Chemical Industry Co., Ltd.) or a phenol compound in which methylol groups thereof are substituted with alkoxymethyl groups or another phenol compound in which methylol groups thereof are substituted with both methylol groups and alkoxymethyl groups. The compounds of the category (c) may be used alone or in combinations.

The total amount of the heat-curable compound(s) in the colorant-containing heat-curable composition in the invention, which is varied in accordance with the material(s), is preferably from 0.1 to 50% by mass, more preferably from 0.2 to 40% by mass, and still more preferably from 1 to 35% by mass, with respect to the total solid contents (mass) in the curable composition.

-Various Additives-

If necessary, various additives can be incorporated into the colorant-containing heat-curable composition in the invention as long as the advantageous effects of the invention are not damaged. Examples of the additives include a binder, a hardener, a curing catalyst, a solvent, a filler, a polymeric compound other than the above-mentioned polymeric compounds, a surfactant, an adhesion promoter, an antioxidant, an ultraviolet absorbent, an aggregation inhibitor, and a dispersant.

-Binder-

In many cases, the binder is added when the liquid dispersion of the pigment is prepared. The binder does not need to be soluble in any alkali, and it is sufficient that the binder is soluble in an organic solvent.

The binder for use in dispersing may be alkali-insoluble, but should be soluble in organic solvents. The binder is preferably a linear organic high-molecular weight polymer soluble in organic solvents. Examples of the linear organic high-molecular weight polymers include polymers having a carboxylic acid group on the side chain such as the methacrylate copolymers, acrylate copolymers, itaconate copolymers, crotonate copolymers, maleate copolymers, partially-esterified maleate copolymers described in JP-A No. 59-44615, Japanese Patent Application Publication (JP-B) Nos. 54-34327, 58-12577, and 54-25957, JP-A Nos. 59-53836 and 59-71048, and others; as well as acidic cellulose derivatives similarly having a carboxylic acid group on the side chain.

In addition to the foregoing, a polymer obtained by adding an acid anhydride to a polymer having a hydroxyl group, a polyhydroxystyrene resin, a polysiloxane resin, poly(2-hydroxyethyl(meth)acrylate), polyvinylpyrrolidone, polyethyleneoxide and polyvinyl alcohol are also useful. A monomer having a hydrophilic group may be copolymerized, and examples thereof include alkoxyalkyl (meth)acrylate, hydroxyalkyl(meth)acrylate, glycerol (meth)acrylate, (meth)acrylamide, N-methylolacrylamide, secondary or tertiary alkylacrylamide, dialkylaminoalkyl(meth)acrylate, morpholine (meth)acrylate, N-vinylpyrrolidone, N-vinylcaprolactam, vinylimidazole, vinyltriazole, methyl(meth)acrylate, ethyl (meth)acrylate, branched or linear propyl(meth)acrylate, branched or linear butyl (meth)acrylate and phenoxyhydroxypropyl(meth)acrylate.

Among these various kinds of binders, a polyhydroxystyrene resin, a polysiloxane resin, an acrylic resin, an acrylamide resin and an acrylic/acrylamide copolymer resin are preferred from the standpoint of heat resistance, and an acrylic resin, an acrylamide resin and an acrylic/acrylamide copolymer resin are preferred from the standpoint of controllability of developing property.

Favorable examples of the acrylic resins include copolymers selected from a monomer selected from benzyl(meth)acrylate, (meth)acrylic acid, hydroxyethyl (meth)acrylate, (meta)acrylamide, and the like, including copolymers such as benzyl methacrylate/methacrylic acid, and benzyl methacrylate/benzyl methacrylamide, KS resist-106 (manufactured by Osaka Organic Chemical Industry Ltd.), Cyclomer P series products (Daicel Chemical Industries, Ltd.). It is possible to improve the adhesiveness, for example to the lower layer, and the properties of the coated surface during spin coating or slit coating, by dispersing the colorant in the binder at higher concentration.

The weight-average molecular weight of the binder (the value on the basis of polystyrene measured by GPC method) is preferably 1,000 to $2 \times 10^5$, more preferably 2,000 to $1 \times 10^5$, and particularly preferably 5,000 to $5 \times 10^4$.

The content of the binder in the colorant-containing heat-curable composition is preferably 0.1 to 50% by mass, more preferably 0.2 to 40% by mass, and particularly preferably 1 to 35% by mass, with respect to the total solid contents (mass) in the composition.

-Hardener-

In the invention, it is preferable to add a hardener when an epoxy resin is used as the heat-curable resin. There are an extremely great number of epoxy resin hardeners that are different in properties such as stability as a mixture of a resin and a hardener, viscosity, hardening temperature, hardening period, and heat generation, and thus, it is necessary to select a suitable hardener according to application, use condition, and work condition of the hardener. Such hardeners are described in detail in Hiroshi Kakiuchi Ed., "Epoxy Resins (Shokodo)", Chapter five. Examples of the hardeners include the followings: catalytic hardeners such as tertiary amines and boron trifluoride-amine complexes; hardeners chemically reacting quantitatively with the functional groups in epoxy resin such as polyamines, acid anhydrides; normal temperature-hardening hardeners such as diethylenetriamine and polyamide resins; medium-temperature hardening hardeners such as diethylaminopropylamine and tris(dimethylaminomethyl)phenol; and high temperature-hardening hardeners such as phthalic anhydride, meta-phenylenediamine; and the like. The hardeners, when seen from the chemical structure, include amines including aliphatic polyamines such as diethylenetriamine, aromatic polyamines such as meta-phenylenediamine, and tertiary amines such as tris (dimethylaminomethyl)phenol; acid anhydrides including phthalic anhydride, polyamide resins, polysulfide resins, boron trifluoride-monoethylamine complexes, initial-stage condensates, for example, of phenol resins, dicyandiamides, and the like.

These hardeners react, polymerize, and harden with epoxy groups by heating, accompanied with increase in crosslinking density. The content of the binder or the hardener is preferably as small as possible for reduction in film thickness, and in particular, the content of the hardener is preferably 35% by mass or less, more preferably 30% by mass or less, and still more preferably 25% by mass or less, with respect to the heat-curable resin.

-Curing Catalyst-

The pigment-containing heat-curable composition according to the invention may contain a curing catalyst. Examples of the curing catalysts favorable when an epoxy resin is used as the curable resin include imidazole compounds, boron trifluoride complexes (in particular, amine complexes), tertiary amines (guanidines and biguanides), titanate esters, and the like. Among them, imidazole compounds are preferable from the point of hardening rate. In addition, phosphine derivatives may also be used as the curing catalyst. The amount of the curing catalyst added is preferably small at approximately $1/10$ to $1/1000$ times, more preferably approximately $1/20$ to $1/500$ times, and still more preferably approximately $1/30$ to $1/250$ times by weight, with respect to the epoxy resin having an epoxy equivalence of approximately 150 to 200.

Specific examples of the curing catalysts include, but are not limited to, commercially available products such as Imidazole Silane series products: "IS-1000", "IS-1000D", "IM-IOOOJ, "SP-1000", "IA-1000A", "IA-100P" IA-100F", "IA-100AD", "IA-100FD", "IM-100F", "IS-3000", and "IS-4000" manufactured by Japan Energy Corporation; "1B2PZ" and "SFZ" manufactured by Shikoku Chemical Corporation.

-Solvent-

The colorant-containing heat-curable composition in the invention can be used in the form of a solution where the composition is dissolved in one out of various solvents. Basically, the solvents used in the colorant-containing heat-curable composition in the invention are each not particularly limited as long as the solvents each satisfy the performance of dissolving the individual components and each give coating property to the colorant-containing heat-curable composition. Specifically, the same solvents as described about the colorant-containing photocurable composition can be preferably used.

-Dispersant-

In addition, the dispersant above may be added to improve dispersion efficiency of the pigment. Any one of known dispersants may be used as the dispersant as it is properly selected, and examples thereof include cationic surfactants, fluorochemical surfactants, polymer dispersants, and the like.

In addition, the graft copolymers described in JP-A No. 10-254133 containing a monomer having a particular acid amido group or a monomer having a quaternary ammonium salt group as the main chain unit are effective in finely dispersing the pigment, and may be used as the dispersant. By using the graft copolymer above it is possible to disperse the pigment finely while the consumption of energy and time is reduced, prevent aggregation and sedimentation of the dispersed pigment over time, and keep the dispersion stable for an extended period of time.

The dispersants may be used alone or in combination of two or more. The amount of the dispersant added to the colorant-containing heat-curable composition according to the invention is normally, preferably approximately 0.1 to 50 parts by mass, with respect to 100 parts by mass of pigment.

-Other Additives-

If necessary, various additives may be further added to the non-photosensitive, colorant-containing curable composition in the invention. Specific examples of the various additives include various additives described about the colorant-containing photocurable composition.

(Method of Preparing Colorant-Containing Heat-Curable Composition)

The method of preparing the colorant-containing heat-curable composition according to the invention favorable in the invention will be described. However, the invention is not limited thereto.

As described above, the colorant-containing heat-curable composition according to the invention characteristically uses a pigment dispersion solution in which a solvent and a pigment are dispersed in the presence of a heat-curable resin. In dispersing the pigment, it is preferable to use pigment particles pulverized into fine particles and having a sharp particle-diameter distribution. Specifically, the pigment preferably has an average particle diameter of approximately 0.01 μm, and contains particles having a particle diameter in the range of 0.01±0.005 μm in an amount of 75% by mass or more. The method of dispersing the pigment is particularly important, in adjusting the pigment particle-diameter distribution in the range above. An example of the dispersion method is a method in combination of dry dispersion (kneading dispersion) in the high-viscosity state by using a kneader or a roll mill such as two-roll mill and wet dispersion (fine dispersion) in the relatively low-viscosity state by using a three-roll mill, a bead mill, or the like. In the dispersion method, it is also preferable to disperse two or more pigments together or to use no or the minimal amount of solvent during kneading dispersion. It is preferable to add a resin component in two portions during the kneading dispersion and during the fine dispersion (two-portion addition) to alleviate the solvent shock, and it is also preferable to use a resin component higher in solubility for prevention of the reaggregation of pigment particles when the processing is changed from kneading dispersion to fine dispersion. It is also effective to use high-rigidity ceramic particles or smaller-diameter beads as the medium in the bead mill used during fine dispersion.

For example, the alkali-soluble resin described above is usable as the resin component.

In the invention, it is particularly preferable to use two or more pigments in combination, disperse the two or more pigments in a high-viscosity state of 50,000 mPa·s or more and additionally in a low-viscosity state of 1000 mPa·s or less. Generally, the pigment is supplied after it is dried by various methods after preparation. The pigment is normally supplied as powder after it is separated from an aqueous medium and dried, but drying for powder demands a lot of heat energy, because the latent vaporization heat of water during drying is required greatly. As a result, the pigment is normally present as the aggregate of secondary particles.

When the colorant is a pigment in the method of preparing the colorant-containing heat-curable composition in the invention, it is preferable that the above-mentioned binder is first subjected to kneading-dispersion into the colorant (pigment) so as to give a relatively high viscosity of 50,000 mPa·s or more (preferably 50,000 to 100,000 mPa·s) after the kneading dispersion. The kneading dispersion treatment may be high-viscosity dispersion or dry dispersion.

It is preferable to add the binder resin described above and other dispersant then as needed to the pigment dispersion solution after kneading dispersion and disperse the mixture finely until it has a relatively low-viscosity of 1,000 mPa·s or less (preferably 100 mPa·s or less) after fine dispersion. The fine dispersion may be low-viscosity dispersion or wet dispersion.

In the kneading dispersion above, the ratio of the solvent to the dispersion is preferably 0 to 20% by mass. It is possible to deposit the components mainly consisting of a vehicle resin component on the pigment particle surface by dispersing the mixture in this manner without use of much solvent, and thus, to convert the pigment particle surface from the solid/gas interface between pigment particle and air to the solid/solution interface between pigment particle and vehicle solution. It is possible to disperse the pigment into the microstate close to the primary particle thereof, by converting the pigment particle surface to an interface from with air to with solution, and agitating the pigment particles.

Thus, it is effective to change the pigment particle surface from the interface with air to that with solution, to disperse the pigment more efficiently. Strong shearing and compressive forces are demanded for the conversion. Thus, it is preferable to use a kneader that applies strong shearing and compressive forces in the kneading dispersion, and also to use high-viscosity pigment particles.

It is also preferable to mix and agitate the mixture together with a fine particulate dispersion medium such as of glass or ceramic in the fine dispersion process. The ratio of the solvent used in the fine dispersion is preferably 20 to 90% by mass with respect to the pigment particles to be dispersed. Because it is necessary to disperse the pigment particles until they are uniformly distributed in the microstate during the fine dispersion, it is preferable to use a dispersing machine that applies strong impact and shearing forces to the aggregated pigment particles and to use low-viscosity pigment particles.

When the colorant is a dye, the dispersion process above is not needed, and the dye may only be dissolved in a suitable solvent.

A heat-curable compound such as an epoxy resin, a curing catalyst, and a hardener may be added to the dispersion of the pigment or the solution of the dye as obtained as described above. Alternatively, in the case that the binder is already a heat-curable compound, a curing catalyst and a hardener are added thereto to provide a heat-curing function. As the need arises, a solvent is added to the blend. In this way, a colorant-containing heat-curable composition in the invention can be prepared.

The first colorant-containing layer in the invention can be formed in the step of applying the above-mentioned colorant-containing heat-curable composition onto a support, and then drying the composition to form the layer. Specifically, for example, the colorant-containing heat-curable composition, which may contain a solvent, is applied directly onto a support, or is applied onto a support to interpose a different layer therebetween by spin coating, slit coating, cast coating, roll coating or some other coating method, whereby the first colorant-containing layer can be formed. The thickness of the first colorant-containing layer is preferably from 0.005 to 0.9 µm, more preferably from 0.01 to 0.7 µm, and still more preferably from 0.02 to 0.65 µm.

It is preferable that the first colorant-containing layer forming step in the invention further includes a heating step, which may be a post-baking step. Specifically, the colorant-containing layer is formed by applying a colorant-containing heat-curable composition in the invention onto a support to form a coating film, and then heat-curing the coating film through a heating step. The heating step may be performed at the same time when the composition is dried after applied, or may be a heat-curing step set up separately after the drying and applying. The heating step can be performed by use of a known heating unit such as an oven or a hot plate preferably at 130 to 300° C., more preferably at 150 to 280° C., and still more preferably at 170 to 260° C. preferably for 10 seconds to 3 hours, more preferably for 30 seconds to 2 hours, and still more preferably for 60 seconds to 60 hours. Considering production efficiency, the time required for the curing is preferably as short as possible.

[Photoresist Layer Forming Step]

The color filter producing method of the invention includes a step (b) of forming a photoresist layer on the first colorant-containing layer formed on the support.

(Photoresist Layer)

After the first colorant-containing layer is formed and cured on the support as described above, a photoresist layer (photosensitive resin layer) is formed on the first colorant-containing layer. Specifically, a positive- or negative-type photosensitive resin composition is applied onto the colorant-containing layer, and the resultant is dried, thereby forming a photoresist layer. In the formation of the photoresist layer in the invention, it is preferable to conduct pre-baking treatment further.

A positive-type resist composition favorable for the positive-type photoresist that is sensitive to a radiation ray, such ultraviolet ray (g ray or i ray) or far-ultraviolet ray such as excimer laser, electron beam, ion beam, or X ray, may be used as the positive-type photosensitive resin composition. Among the radiation rays, g- and i-rays are preferable for irradiation of the photosensitive resin layer for the object of the invention, and i-ray irradiation is more preferable.

Specifically, the positive-type photosensitive resin composition is preferably a composition containing a quinone diazide compound and an alkali-soluble resin. The positive-type photosensitive resin composition containing a quinone diazide compound and an alkali-soluble resin is used favorable as the positive-type photoresist, because it changes from the alkali insoluble state into the alkali-soluble state by decomposition of the quinone diazide group into carboxyl group by irradiation of a light at a wavelength of 500 nm or less. The positive-type photoresist is significantly superior in resolution and thus, used in production of integrated circuits such as IC and LSI. The quinone diazide compound is for example a naphthoquinone diazide compound.

Recently the width of the wiring on integrated circuits is becoming finely narrowed, along with the increase in integration density, and thus, conventional wet etching is mostly replaced with dry etching. In the dry etching wherein the shape of the etched layer reflects the shape of the resist, an improper shaped resist results in etching in the region where etching is undesirable and consequently, in defects in the integrated circuit and deterioration in the yield thereof. Thus, there exists an increasing need for a resist that gives a smaller amount of development residue (scum) and is superior in profile. The dry etching may also cause increase in substrate temperature, thermal deformation of resist pattern, and hence, deterioration in dimensional accuracy. Thus, there is a need for a heat resistant resist more than ever. When the positive-type photoresists commonly used are viewed from the viewpoints above, there are many commercial products that satisfy the requirements in various properties such as profile, scum, resolution and heat resistance; and examples thereof include FH-6000 series products such as "FH-6400L" and "FH-6800L"; FHi-3000 series products such as "FHi-3200" and "FHi-3950"; FHi-600 series products such as "FHi-644" and "FHi-645"; and Fi-SP series products such as "F1-SP2" manufactured by Fuji film Electronic Materials Co., Ltd. However, in addition to those above, any positive-type photoresists that have a mask shape suitable for patterning may be used as the positive-type photosensitive resin composition, independently of whether there are commercially available products.

The negative-type photosensitive resin composition is, for example, a negative-type photoresist composition sensitive to a radiant ray such as ultraviolet ray (g ray or i ray), far ultraviolet ray, X ray, electron beam, molecular beam, γ ray, or synchrotron radiation. More specifically, it is preferably a negative-type photoresist composition superior in resolution and sensitivity practically that does not generate microdefects due to development residue. The negative-type photoresist according to the invention is coated on a color layer by spin coating or roller coating to a thickness, for example, of 0.5 to 3 µm. Then, the coated film is heated, dried, exposed via an exposure mask to UV light, printing a circuit pattern or the like, and, additionally as needed, heated after exposure (PEB) and developed, to give a negative image. It is possible to form a pattern on the heat-curable resin layer, additionally by etching the layer by using the image as a mask. Specific application fields thereof include production of semiconductors such as IC, production of circuit boards for liquid crystal devices and thermal heads, and production of other photoapplication products. It is also possible to apply it as a planographic printing plate, by using the difference in ink affinity between the image and the support substrate. There is a need for improvement in the resolution of photoresists, in the trend toward higher integration in production of semiconductor substrates.

The negative-type photosensitive resin layer preferably contains a photopolymerization initiator and a polymerizable compound having an ethylenic unsaturated bond. In regard to the negative-type photosensitive resin composition used in preparation of such a photosensitive resin layer, there are known the following methods. For example, JP-B No. 54-23574 discloses a method of photo-curing a novolak resin in combination with a photo-acid generator of an organic halide. German Patent No. 2057473 describes that a phenol resin such as novolak can be applied as the binder for the photo-curable composition containing a photo-acid generator of diazo compound, a methylolated melamine, and others.

JP-A No. 60-263143 discloses a composition consisting of a photo-acid generator, acid-curing aminoblast resin such as melamine resin, and a normal novolak resin that can be developed in an aqueous system and gives a thermally stable negative image. JP-A No. 62-164045 discloses that use of an organic halide absorbing the light in the far-ultraviolet range as the photo-acid generator in such a composition is advantageous. Similarly, JP-A No. 2-52348 discloses that use of an organic halide having a pKa in a particular range as the photo-acid generator in a similar system is advantageous. Further, JP-A No. 2-154266 discloses that use of an oxime-sulfone acid ester as the photo-acid generator in a similar photo-curable composition is advantageous. Alternatively, JP-A No. 2-146044 discloses that a composition in combination of a photo-acid generator containing a particular trichlorotriazine group, an alkoxylated melamine, and a novolak resin containing m-cresol at 30% or more is useful for high-energy ray exposure. Further, EP Patent No. 397460A discloses use of a highly branched novolak resin in a similar composition. Such negative-type photosensitive resin compositions are commercially available, and examples thereof include SC series products such as "SC-60" and "SC-450"; HR series products such as "HR-100" and "HR-200"; and HNR series products such as "HNR-80" and "HNR-120" manufactured by Fuji film Electronic Materials Co., Ltd. However, in addition to those above, any positive-type photoresist that has a mask shape suitable for patterning may be used as the positive-type photosensitive resin composition, independently of whether there are commercially available products.

The coating method described above is preferably used as a coating method for the photosensitive resin composition. The thickness of specific photosensitive resin layer is preferably 0.01 to 3 µm, more preferably 0.1 to 2.5 µm, and still more preferably 0.15 to 2 µm.

[Image Forming Step]

The color filter producing method of the invention includes an image forming step (c) of removing the photoresist layer in a region where a second colorant-containing layer different from the first colorant-containing layer (i.e., the already-formed colorant-containing layer) is to be formed over the support, thereby forming an image on the first colorant-containing layer. The first colorant-containing layer may be a single colorant-containing layer, or may be made of two or more colorant-containing layers. In the image forming step, light is radiated onto the photoresist layer and into an image form corresponding to the region where the second colorant-containing layer is to be formed over the support, and then the photoresist layer is developed, so that an etching mask (pattern image) can be formed.

In the invention, an image, which is obtained by removing the photoresist layer in the region where the second colorant-containing layer is to be formed over the support, is formed on the first colorant-containing layer. In this way, the surface of the first colorant-containing layer (i.e., the surface opposite to the surface facing the support) is uncovered in the form of the above-mentioned image. Out of the surface of the first colorant-containing layer, a region other than the region where the second colorant-containing layer is to be formed over the support is covered with the photoresist layer.

In the color filter produced by the producing method of the invention, the second colorant-containing layer is formed over the support, whereby not only the pixel species made of the first colorant-containing layer but also another pixel species can be formed. Since the photoresist layer, which is a masking member, can be made into a fine pattern form and has a rectangular shape, each of pixels of the color filter produced by the producing method of the invention can be made into a fine rectangular shape.

The radiation of the light onto the photoresist layer can be attained by radiating the g-, h- or i-line, or the like, preferably the i-line, onto the positive- or negative-type resin composition which constitutes this layer through a mask having a predetermined pattern (i.e., an image-form pattern).

The developing solution is not particularly limited, if it does not affect the color layers containing colorant and can dissolve the exposed region of the positive resist and the unhardened region of the negative resist. Specifically, mixtures of various organic solvents and aqueous alkaline solutions are used favorably.

Preferred examples of the alkali aqueous solution include alkali aqueous solutions obtained by dissolving such an alkali compound to a concentration of 0.001 to 10% by mass, and preferably from 0.01 to 1% by mass, as sodium hydroxide, potassium hydroxide, sodium carbonate, sodium silicate, sodium metasilicate, aqueous ammonia, ethylamine, diethylamine, dimethylmethanolamine, tetramethylammonium hydroxide, tetraethylammonium hydroxide, choline, pyrrole, piperidine and 1,8-diazabicyclo-(5.4.0)-7-undecene. In the case where a developer containing the alkali aqueous solution is used, the layer thus developed is generally washed with water.

[Etching Step]

The color filter producing method of the invention includes an etching step (d) of removing the first colorant-containing layer in the above-mentioned region, where the second colorant-containing layer is to be formed, into the form of the image formed in the image forming step by dry etching. According to the above-mentioned image forming step, in the first colorant-containing layer, only a region corresponding to the region where the second colorant-containing layer is to be formed over the support gets uncovered, as described above. In this state, anisotropic etching based on plasma etching treatment using an etching gas is performed, thereby permitting the first colorant-containing layer to be removed into the form of the image formed in the image forming step.

In the invention, it is preferable to control the overetch ratio by means of an end point detector. This way makes it possible to restrain the support amount etched by the etching treatment whether the present case is a case where the surface of the support is made of a $Si_3N_4$ layer which is a passivation film or a case where the support is made of a curable resin transparent to visible rays.

The gas used in the dry etching in the invention may be a known gas. Preferable examples thereof include $O_2$ and $CF_4$. Typical examples of a know method for the dry etching are described in JP-A Nos. 59-126506, 59-46628, 58-9108, 58-2809, 57-148706, and 61-41102.

[Photoresist Layer Removing Step]

The color filter producing method of the invention includes a photoresist layer removing step (e) of removing the photoresist layer remaining after the etching step. After the end of the etching treatment, the resist as the etching mask (i.e., the cured photosensitive resin layer) is removed with a peeling solution or solvent for exclusive use.

The photoresist layer removing step in the invention preferably includes a step (1) of supplying a peeling solution or a solvent onto the photoresist layer to make the photoresist layer into a layer-removable state, and a step (2) of using washing water to remove the photoresist layer. The step (1), wherein a peeling solution or a solvent is supplied onto the photoresist layer to make the photoresist layer into a layer-removable state, may be, for example, a paddle development step of supplying a peeling solution or a solvent at least onto the photoresist layer and causing the solution or the solvent to remain thereon for a predetermined time. The time when the peeling solution or the solvent is caused to remain is not particularly limited, and is preferably from several tens of seconds to several minutes.

The step (2), wherein washing water is used to remove the photoresist layer, may be, for example, a step of spraying washing water onto the photoresist layer from a spray-type or shower-type jet nozzle, so as to remove the photoresist layer. The washing water is preferably pure water. The jet nozzle may be a jet nozzle wherein the jet region thereof extends over the whole of the substrate, or a mobile jet nozzle wherein the mobile region thereof extends over the whole of the substrate. In the case of the mobile jet nozzle, the photoresist layer can be more effectively removed by jetting the washing water while moving the nozzle two or more times from the center of the support to each end of the support.

The peeling solution generally contains an organic solvent, and may further contain an inorganic solvent. Examples of the organic solvent include 1) hydrocarbon compounds, 2) halogenated hydrocarbon compounds, 3) alcohol compounds, 4) ether or acetal compounds, 5) ketone or aldehyde compounds, 6) ester compounds, 7) polyhydric alcohols, 8) carboxylic acid or carboxylic acid anhydride compounds, 9) phenolic compounds, 10) nitrogen-containing compounds, 11) sulfur-containing compounds, and 12) fluorine-containing compounds. The peeling solution in the invention preferably contains a nitrogen-containing compound, and more preferably contains a nitrogen-containing acyclic compound and a nitrogen-containing cyclic compound.

The nitrogen-containing acyclic compound is preferably a nitrogen-containing acyclic compound having a hydroxyl group. Specific examples thereof include monoisopropanolamine, diisopropanolamine, triisopropanolamine, N-ethylethanolamine, N,N-dibutylethanolamine, N-butylethanolamine, monoethanolamine, diethanolamine, and triethanolamine. Preferable are monoethanolamine, diethanolamine, and triethanolamine, and more preferable is monoethanolamine ($H_2NCH_2CH_2OH$)

Examples of the nitrogen-containing cyclic compound include isoquinoline, imidazole, N-ethylmorpholine, ε-caprolactam, quinoline, 1,3-dimethyl-2-imidazolidinone, α-picoline, β-picoline, γ-picoline, 2-pipecholine, 3-pipecholine, 4-pipecholine, piperazine, piperidine, pyrazine, pyridine, pyrrolidine, N-methyl-2-pyrrolidone, N-ethylmorpholine, N-phenylmorpholine, 2,4-lutidine, and 2,6-lutidine. Preferable are N-methyl-2-pyrrolidone and N-ethylmorpholine, and more preferable is N-methyl-2-pyrrolidone (NMP).

The peeling solution in the invention preferably contains a nitrogen-containing acyclic compound and a nitrogen-containing cyclic compound, and more preferably contains at least one selected from monoethanoamine, diethanolamine and triethanolamine as the nitrogen-containing acyclic compound, and at least one selected from N-methyl-2-pyrrolidone and N-ethylmorpholine as the nitrogen-containing cyclic compound. The peeling solution even more preferably contains monoethanolamine and N-methyl-2-pyrrolidone. It is desirable that the content of the nitrogen-containing acyclic compound is 9 parts by mass or more and 11 parts by mass or less with respect to 100 parts by mass of the peeling solution and the content of the nitrogen-containing cyclic compound is 65 parts by mass or more and 70 parts by mass or less with respect to 100 parts by mass thereof. The peeling solution in the invention is preferably a solution wherein a mixture of a nitrogen-containing acyclic compound and a nitrogen-containing cyclic compound is diluted with pure water.

[Second Colorant-Containing Forming Step]

The color filter producing method of the invention includes a second colorant-containing layer forming step (f) of forming the second colorant-containing layer, which is different from the first colorant-containing layer, at least in the region where the first colorant-containing layer has been removed (i.e., the region where the second colorant-containing layer is to be formed over the support). The second colorant-containing layer preferably contains at least a colorant different from the colorant contained in the first colorant-containing layer.

In the second colorant-containing layer forming step in the invention, a colorant-containing photocurable composition or a colorant-containing heat-curable composition is supplied at least to the region where the first colorant-containing layer has been removed, thereby making it possible to form the second colorant-containing layer. The step (f) is particularly preferably a step of supplying a colorant-containing heat-curable composition at least to the region where the first colorant-containing layer has been removed, so as to form the second colorant-containing layer. In the invention, the colorant-containing heat-curable composition can be supplied to not only the region where the first colorant-containing layer has been removed but also the region where the first colorant-containing layer remains. This way makes it possible to supply the colorant-containing heat-curable composition more certainly to the region where the first colorant-containing layer has been removed.

As described above, the color filter producing method of the invention is characterized by forming at least the second or following colorant-containing layer by embedding a curable composition which contains a colorant into concaves made in the existing colorant-containing layer. The colorant-containing photocurable composition and the colorant-containing heat-curable composition are preferably those described about the first colorant-containing layer forming step.

The method for supplying the colorant-containing heat-curable composition is preferably a method of applying the colorant-containing heat-curable composition to supply the composition to the region where the first colorant-containing layer has been removed. About the method of applying the colorant-containing heat-curable composition, the application method and application conditions described previously can be used.

When the colorant-containing heat-curable composition supplied to the region where the first colorant-containing layer has been removed is cured through the post-baking step described previously, a second colorant-containing layer, which is different from the first colorant-containing layer, can be formed.

The colorant-containing heat-curable composition may be the colorant-containing heat-curable composition described previously. When the first colorant-containing layer is formed by use of a colorant-containing heat-curable composition, it is preferable that the second colorant-containing layer contains at least a colorant different from the colorant contained in the first colorant-containing layer. When the first colorant-containing layer is formed by use of a colorant-containing photocurable composition, it is preferable that the above-mentioned colorant-containing heat-curable composition is a colorant-containing heat-curable composition containing at least a colorant different from the colorant contained in the colorant-containing photocurable composition.

The color filter producing method of the invention preferably contains at least two step-groups of performing the following successively: the photoresist layer forming step (b), the image forming step (c), the etching step (d), the photoresist layer removing step (e), and the second colorant-containing layer forming step (f). When the step-group of the steps (a) to (f) is carried out one more time, it is possible to form one more colorant-containing layer which is different from the two already-formed colorant-containing layers (in, for example, two colors) and which is in, e.g., a color different from the two colors. Accordingly, when the invention includes the step-groups the number of which is two, a color filter having at least three colorant-containing layers (in, e.g., three colors) can be produced.

The color filter producing method of the invention preferably further contains the step of removing the colorant-containing layer(s) laminated over the colorant-containing layer which is arranged at the lowest position (which is nearest to the support) out of the two colorant-containing layers and optional colorant-containing layers laminated over the support. In the case that in the invention the second colorant-containing layer is formed on both of the support from which the first colorant-containing layer has been removed and the first colorant-containing layer, it is preferable to remove the second colorant-containing layer laminated and formed on the first colorant-containing layer. This way makes it possible to heighten the color purity of pixels made of the first colorant-containing layer. In the case that in the invention a third colorant-containing layer is further formed, it is preferable to remove the second and third colorant-containing layers laminated and formed on the first colorant-containing layer and the third colorant-containing layer laminated and formed on the second colorant-containing layer. This way makes it possible to heighten the color purities of pixels made of the first and second colorant-containing layers.

The method for removing the colorant-containing layer(s) laminated and formed on the lower colorant-containing layer(s) may be etch-back treatment or CMP treatment. In the etch-back treatment, it is allowable to adopt any one of an embodiment wherein a photoresist layer is formed on the colorant-containing layer(s) and an embodiment wherein no photoresist layer is formed on the colorant-containing layer(s). The colorant-containing layer(s) laminated and formed on the lower colorant-containing layer(s) is/are removed by the above-described method, whereby a color filter, which has a desired hue and is excellent in flatness, can be obtained.

The invention may further contain an uncovering step of making a dicing line, a scribe line, or a PAD section uncovered. In the uncovering step, the color filter layer(s) or regions to be protected are covered with a photoresist layer, and then the line or section can be made uncovered by ashing or etching. Thereafter, the photoresist layer can be dissolved and removed with an organic solvent or the like. It is allowable to adopt an embodiment wherein the uncovering step is performed after the above-mentioned individual layers are formed, or an embodiment wherein the uncovering step is performed after the colorant-containing layer as a layer to be finally formed is coated, subjected to heat treatment and then made flat by etching or polishing treatment. With reference to the drawings, an embodiment of the color filter producing method of the invention will be described below.

EXPLANATION OF REFERENCE NUMBERS

Reference numbers 1 to 16 in the drawings each represent the following:
1 Support
2 First colorant-containing layer
3, 6 and 10 Photoresist layers
4, and 11 Uncured latent image regions
5, and 12 Uncovered regions of colorant-containing layer
7, and 13 Uncovered regions of support
8 Second colorant-containing layer formation region
9 Second colorant-containing layer
14 Third colorant-containing layer
15 Second colorant-containing layer
16 Third colorant-containing layer First Colorant-Containing Layer Forming Step (a):

In FIG. 1, reference number 1 represents a support, and a colorant-containing heat-curable composition corresponding to a predetermined color component is applied onto a surface of this support so as to give a desired film thickness, and then the resultant is subjected to post-baking treatment, thereby forming a first colorant-containing layer 2.

(b) Photoresist Layer Forming Step

Figure 2:
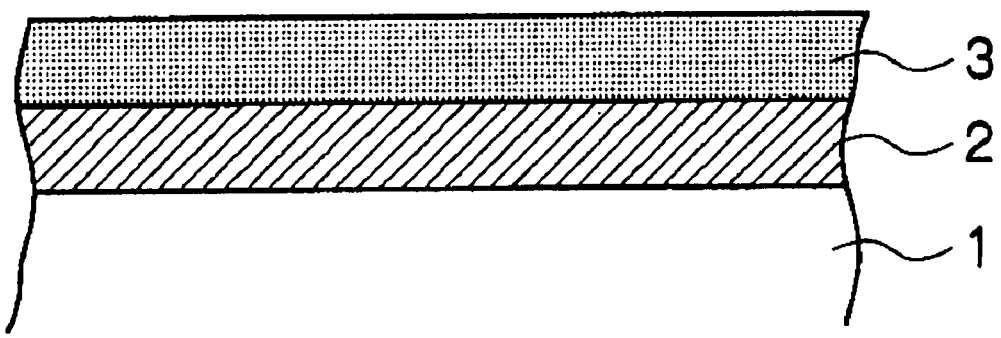
FIG. 2 is a sectional view illustrating a photoresist layer formed on the colorant-containing layer.

As illustrated in FIG. 2, a positive- or negative-type photoresist composition is applied onto the first colorant-containing layer 2, and then the resultant is subjected to pre-baking treatment, thereby forming a photoresist layer 3 having a desired film thickness.

Figure 3:
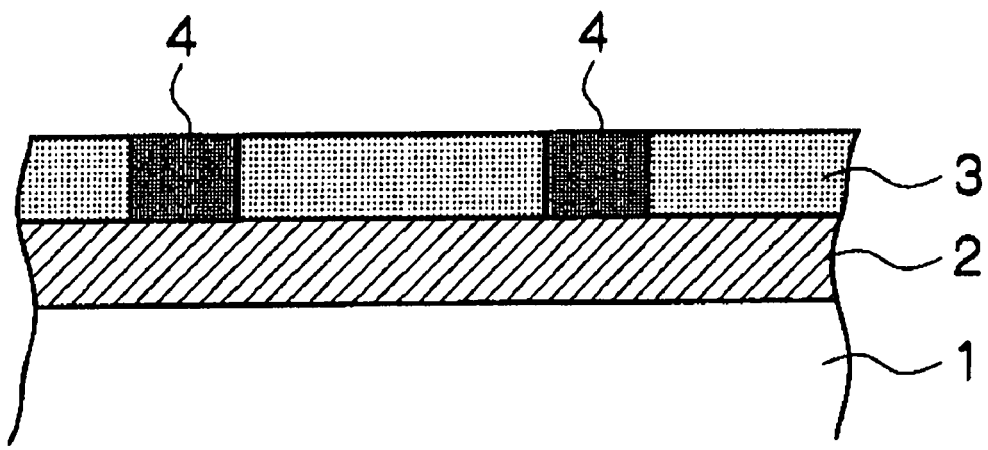
FIG. 3 is a sectional view illustrating the photoresist layer after exposure to light is performed.
Figure 4:
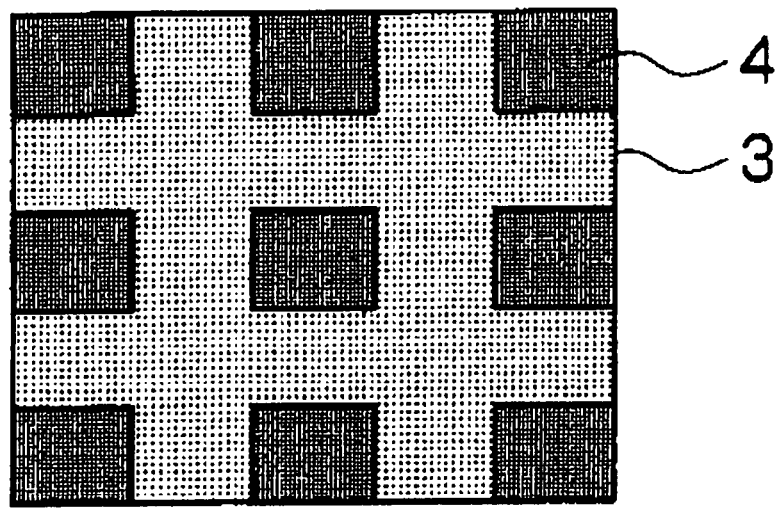
FIG. 4 is a plan view illustrating a situation obtained when the situation illustrated in FIG. 3 is viewed from the side opposite to the support side thereof.
Figure 5:
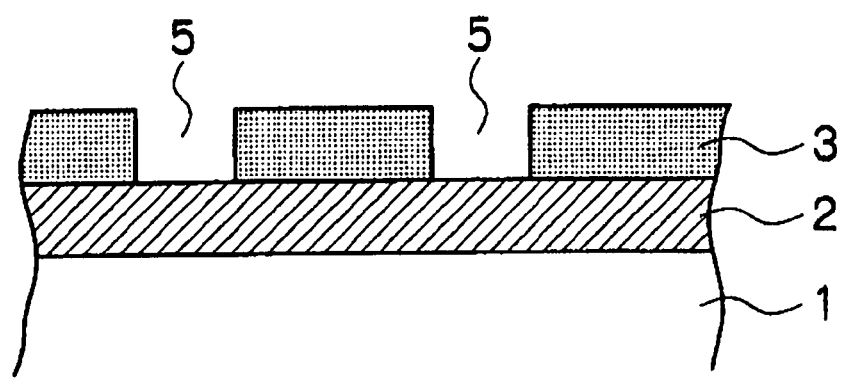
FIG. 5 is a sectional view illustrating the photoresist layer after developing treatment is conducted.

Image Forming Step (c):

As illustrated in FIG. 3, light is radiated onto the photoresist layer 3 through a photomask having a region corresponding to a predetermined filter array (a group of pixels) for forming a second colorant-containing layer, so as to form a latent image region 4. FIG. 4 is a plan view illustrating a situation obtained when the situation illustrated in FIG. 3 is viewed from the above thereof. FIG. 5 illustrates a situation after photoresist layer portions to be removed in the latent image region 4 is removed by developing treatment. Uncovered colorant-containing layer portions 5, where the photoresist layer has been removed, are formed on the support. The uncovered colorant-containing layer portions 5 correspond to the region where the first colorant-containing layer should be removed, and the photoresist layer is removed only in the region where the second colorant-containing layer is to be formed, so as to leave the photoresist layer 3 on the first colorant-containing layer where the first colorant-containing layer, a third colorant-containing layer, and optional colorant-containing layers to be subsequently formed are to be formed.

Figure 6:
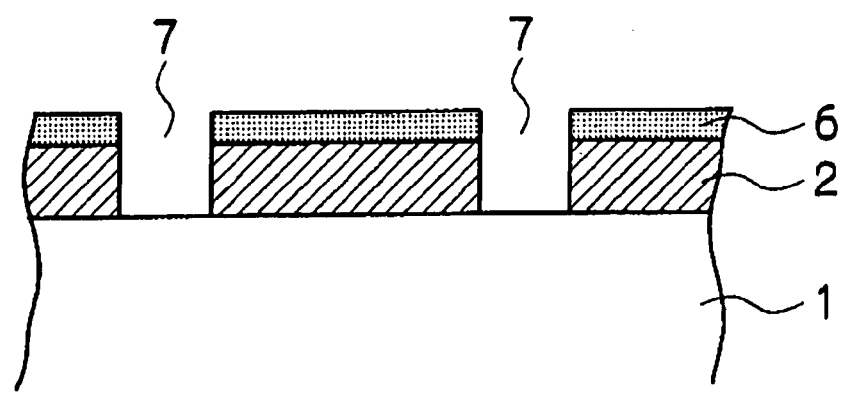
FIG. 6 is a sectional view illustrating the structure of the layers after etching treatment is conducted.

Etching Step (d):

Next, as illustrated in FIG. 6, the photoresist layer 6 is used as a mask to conduct etching treatment, thereby removing the first colorant-containing layer 2 to form a region where the second colorant-containing layer is to be formed (uncovered support portions 7).

Figure 7:
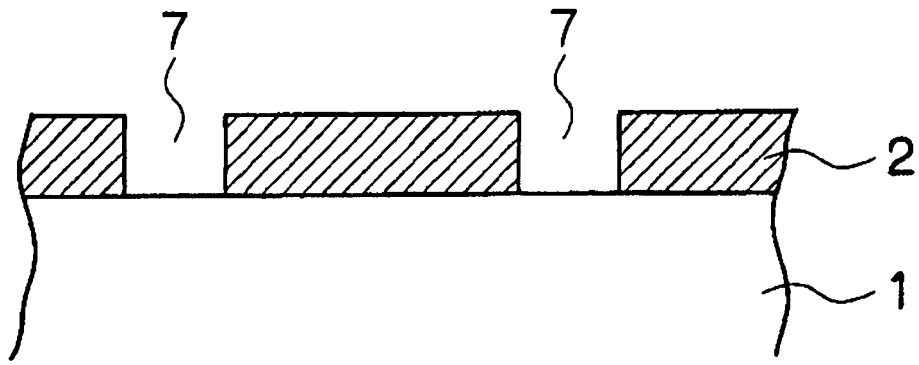
FIG. 7 is a sectional view illustrating the structure of the layers after the photoresist layer is removed.
Figure 8:
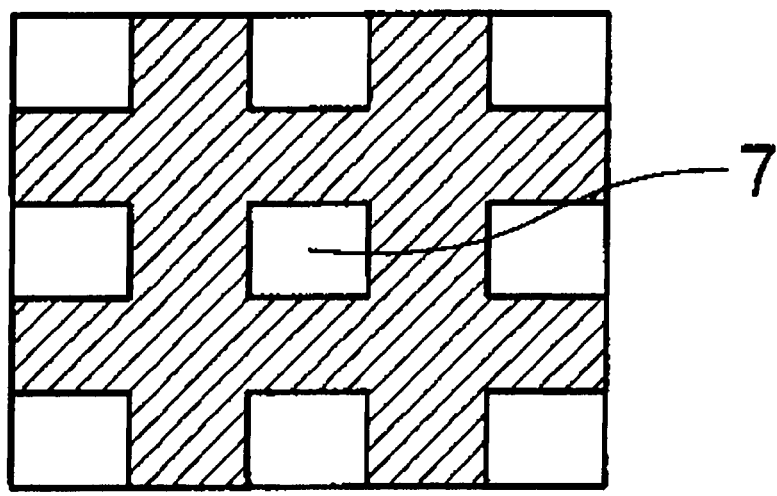
FIG. 8 is a plan view illustrating a situation obtained when the situation illustrated in FIG. 7 is viewed from the side opposite to the support side thereof.

Photoresist Layer Removing Step (e):

After the etching treatment is conducted, the photoresist layer 6 is dissolved and removed by a peeling solution or the like. As illustrated in FIG. 7, after the end of the photoresist layer removing step, the first colorant-containing layer 2 is removed only in the uncovered support portions 7, where the second colorant-containing layer is to be formed. FIG. 8 is a plan view illustrating a situation obtained when the situation illustrated in FIG. 7 is viewed from the above thereof.

Figure 9:
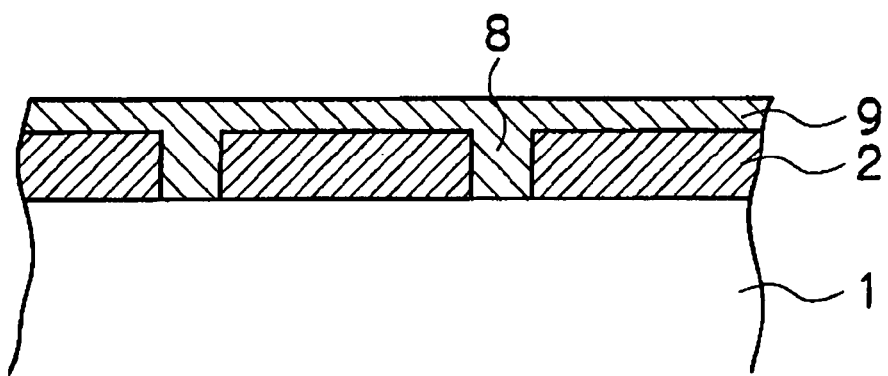
FIG. 9 is a sectional view illustrating a situation that a second colorant-containing layer is formed.

Second Colorant-Containing Layer Forming Step (f):

As illustrated in FIG. 9, a colorant-containing heat-curable composition corresponding to a color component of the second colorant-containing layer is applied onto the support 1 having the first colorant-containing layer formed thereon, so as to give such a film thickness that the composition is embedded in a region 8 where the second colorant-containing layer is to be formed. The resultant is then subjected to post-baking treatment to form the second colorant-containing layer, which is shown as a layer 9.

Photoresist Layer Forming Step (b'):

A positive- or negative-type photoresist is applied onto the second colorant-containing layer, and then the resultant is subjected to pre-baking treatment to form a photoresist layer again, which is not illustrated.

Figure 10:
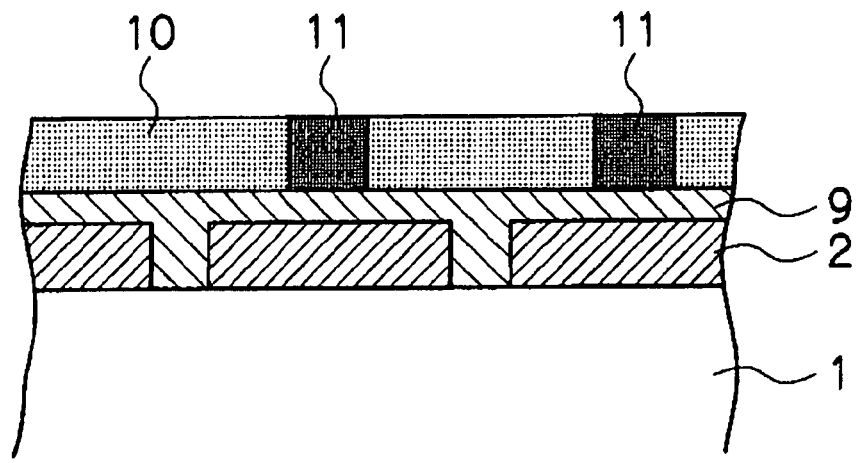
FIG. 10 is a sectional view illustrating a photoresist layer after exposure to light is performed.
Figure 11:
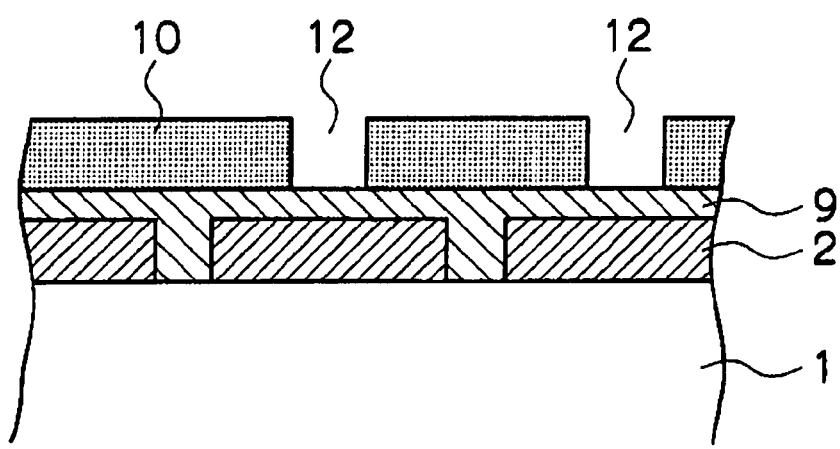
FIG. 11 is a sectional view illustrating the photoresist layer after developing treatment is conducted.

Image Forming Step (c'):

As illustrated in FIG. 10, light is radiated onto the above-mentioned photoresist layer, which is shown as a photoresist layer 10, through a photomask having a region corresponding to a predetermined filter array (pixel portions) for forming a third colorant-containing layer, so as to form a latent image region 11. The photoresist layer portions to be removed in the latent image region 11 are removed by developing treatment. As illustrated in FIG. 11, uncovered colorant-containing layer portions 12, where the photoresist layer has been removed, correspond to regions where the first and second colorant-containing layers should be removed. Thus, the photoresist layer is removed only in the region where the third colorant-containing layer is to be formed.

Figure 12:
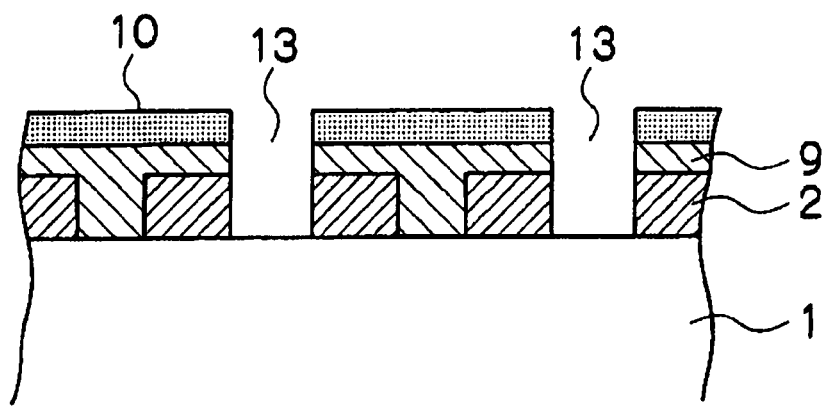
FIG. 12 is a sectional view illustrating the structure of the layers after etching treatment is conducted.

Etching Step (d'):

As illustrated in FIG. 12, the photoresist layer 10 subjected to the developing treatment is used as a mask to conduct etching treatment only in the above-mentioned region where the third colorant-containing layer is to be removed, which is shown as a region 13. At this time, by the etching treatment, not only the second colorant-containing layer 9 but also the first colorant-containing layer 2 are simultaneously removed, so as to make the surface of the support in the region where the third colorant-containing layer is to be formed (the uncovered support portions 13) uncovered.

Figure 13:
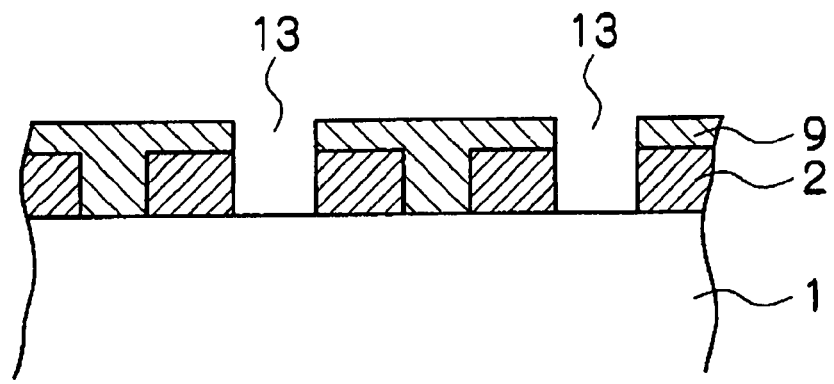
FIG. 13 is a sectional view illustrating the structure of the layers after the photoresist layer is removed.
Figure 14:
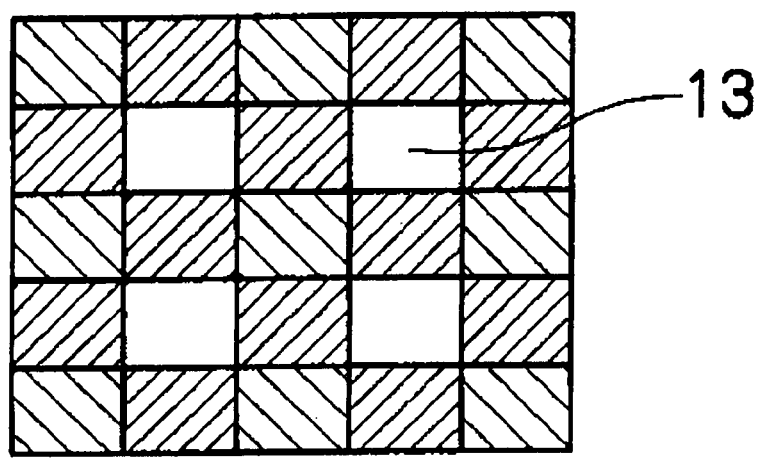
FIG. 14 is a plan view illustrating a situation obtained when the situation illustrated in FIG. 13 is viewed from the side opposite to the support side thereof.

Photoresist Layer Removing Step (e'):

After the etching treatment is conducted, the photoresist layer is dissolved and removed by a peeling solution or the like. As illustrated in FIG. 13, after the end of the photoresist layer removing step, the first colorant-containing layer and the second colorant-containing layer are removed only in the uncovered support portions 13, where the third colorant-containing layer is to be formed. Moreover, the second colorant-containing layer is laminated and formed on the region of the first colorant-containing layer. FIG. 14 is a plan view illustrating a situation obtained when the situation illustrated in FIG. 13 is viewed from the above thereof.

Figure 15:
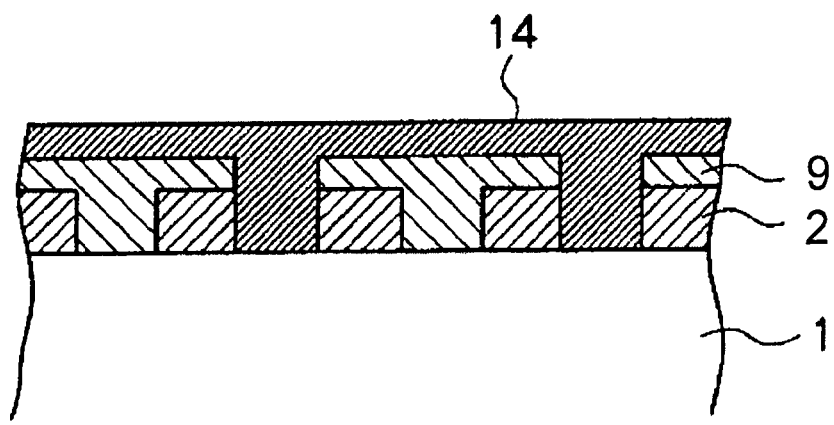
FIG. 15 is a sectional view illustrating a situation that a third colorant-containing layer is formed.

Third Colorant-Containing Layer Forming Step (f'):

As illustrated in FIG. 15, a colorant-containing heat-curable composition corresponding to a color component of the third colorant-containing layer is applied onto the support having the first and second colorant-containing layers formed thereon, so as to give such a film thickness that the composition is embedded in the region 13, where the third colorant-containing layer is to be formed. The resultant is then subjected to post-baking treatment to form the third colorant-containing layer, which is shown as a layer 14.

Figure 16:
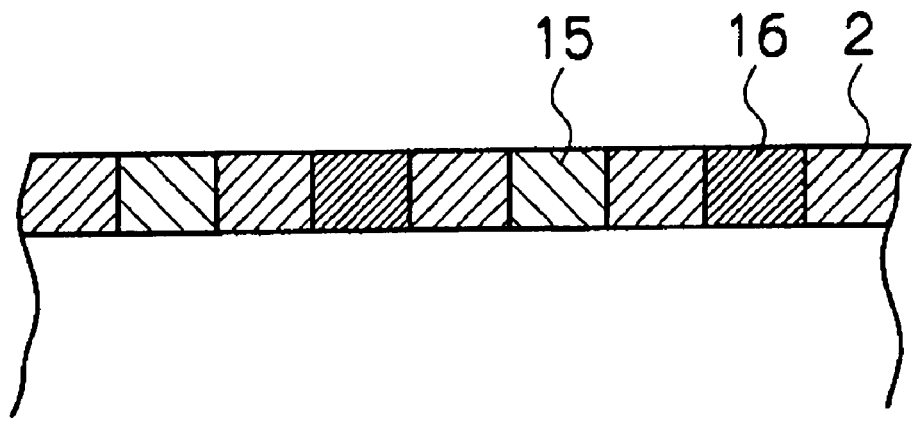
FIG. 16 is a sectional view illustrating the layer structure of the color filter after a final step.
Figure 17:
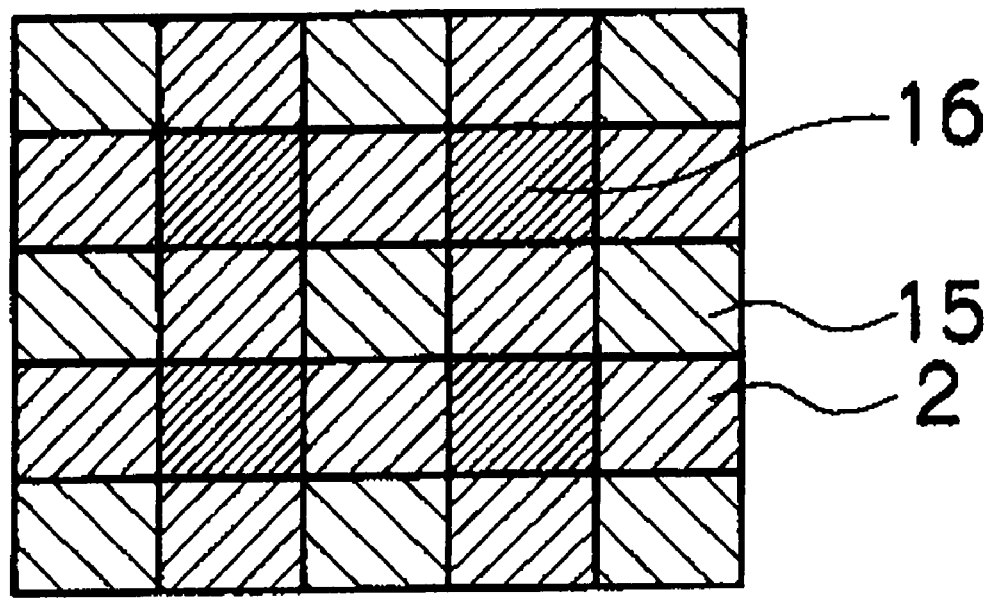
FIG. 17 is a plan view illustrating a situation obtained when the situation illustrated in FIG. 16 is viewed from the side opposite to the support side thereof.

Final Step (g):

After the formation of the third colorant-containing layer, the workpiece is etched or polished by etch-back treatment or CMP treatment until the surface of the first colorant-containing layer is made uncovered. This method makes it possible to produce a color filter composed of the first, second and third colorant-containing layers 2, 15 and 16, as illustrated in FIG. 16. FIG. 17 is a plan view obtained when the color filter illustrated in FIG. 16 is viewed from the above thereof.

EXAMPLES

The present invention will be specifically described by way of the following examples; however, the invention is not limited to these examples.

In the case of conducting a treatment using a commercially available processing solution in each step described below, the treatment was conducted in accordance with a method designated by a manufacturer unless otherwise specified.

Example 1

[First Step]

A green heat-curable composition (trade name: SG-5000L, manufactured by FUJIFILM Electronic Materials Co., Ltd.) was applied onto a silicon substrate with a spin coater to give a coating film having a film thickness of 0.8 µm. Thereafter, a hot plate was used to heat the resultant at 220° C. for 5 minutes to cure the coating film. The film thickness of the colorant-containing layer made of this composition (trade name: SG-5000L) was 0.65 µm.

Next, a positive-type photoresist (trade name: FHi622BC, manufactured by FUJIFILM Electronic Materials Co., Ltd.) was applied onto the green colorant-containing layer with a device (trade name: Mark 8, manufactured by Tokyo Electron Ltd.), and then the photoresist was pre-baked to form a photoresist layer having a film thickness of 0.8 µm.

Next, an i-line stepper (manufactured by Canon Inc.) was used to radiate the i-line onto the photoresist region corresponding to a red filter array at 350 mJ/cm$^2$ and subsequently the resultant was heated at 110° C. for 1 minute. Thereafter, the resultant was developed with a developing solution (trade name: FHD-5, manufactured by FUJIFILM Electronic Materials Co., Ltd.) for 1 minute, and then subjected to post-baking treatment at 120° C. for 2 minutes to remove the photoresist in the region where the red filter array was to be formed. The pattern size at this time was set to 1.0 µm.

Next, in a dry etching machine (trade name: U-621, manufactured by Hitachi High-Technologies Corp.), the workpiece was subjected to etching treatment at an RF power of 800 W, a chamber pressure of 4 Pa, a substrate temperature of 50° C. and an over-etch ratio of 10%, using Ar, $CF_4$ and $O_2$, as gases, having flow rates of 800 mL/min., 200 mL/min., and 50 mL/min., respectively.

Next, a photoresist peeling solution (trade name: MS230C, manufactured by FUJIFILM Electronic Materials Co., Ltd.) was used to conduct peeling treatment for 120 seconds to remove the photoresist. As a result, the workpiece was in a state that the colorant-containing layer made of the green heat-curable composition (trade name: SG-5000L) was formed in others than the region where the red filter array was to be formed and the underlying substrate was uncovered only in the region where the red filter array was to be formed.

[Second Step]

A spin coater was used to apply a red heat-curable composition (trade name: SR-5000L, manufactured by FUJIFILM Electronic Materials Co., Ltd.) onto the substrate undergoing the first step to give a coating film having a film thickness of 0.8 µm in the region where the red filter array was to be formed, and then a hot plate was used to heat the workpiece at 220° C. for 5 minutes to cure the coating film. After the heat treatment, the film thickness of the colorant-containing layer made of the red composition (trade name: SR-5000L) was 0.65 µm.

Next, a positive-type photoresist (trade name: FHi622BC, manufactured by FUJIFILM Electronic Materials Co., Ltd.) was applied onto the substrate, and then pre-baked to form a photoresist layer to give a film thickness of 0.8 µm.

Next, alignment treatment for superposition was carried out, and then the i-line stepper was used to radiate the i-line onto the photoresist region corresponding to a blue filter array at 350 mJ/cm$^2$, and subsequently the resultant was heated at 110° C. for 1 minute. Thereafter, the resultant was developed with a developing solution (trade name: FHD-5, manufactured by FUJIFILM Electronic Materials Co., Ltd.) for 1 minute, and then subjected to post-baking treatment at 120° C. for 2 minutes to remove the photoresist in the region where the blue filter array was to be formed. The pattern size at this time was set to 1.0 μm.

Next, in the dry etching machine, the workpiece was subjected to etching treatment at an RF power of 800 W, a chamber pressure of 4 Pa, a substrate temperature of 50° C. and an over-etch ratio of 10%, using Ar, $CF_4$ and $O_2$, as gases, having flow rates of 800 mL/min., 200 mL/min., and 50 mL/min., respectively.

Next, a photoresist peeling solution (trade name: MS230C, manufactured by FUJIFILM Electronic Materials Co., Ltd.) was used to conduct peeling treatment for 120 seconds to remove the photoresist. As a result, the workpiece was in a state that the colorant-containing layer made of the red heat-curable composition (trade name: SR-5000L) was formed in regions other than the region where the blue filter array was to be formed and the underlying substrate was uncovered only in the region where the blue filter array was to be formed. Moreover, the workpiece was in a state that the colorant-containing layer made of the red composition (trade name: SR-5000L) was laminated on the region where a green filter array was to be formed.

[Third Step]

A spin coater was used to apply a blue heat-curable composition (trade name: SB-5000L, manufactured by FUJIFILM Electronic Materials Co., Ltd.) onto the substrate undergoing the second step to give a coating film having a film thickness of 0.8 μm in the region where the blue filter array was to be formed. Then, a hot plate was used to heat the workpiece at 220° C. for 5 minutes to cure the coating film. After the heat treatment, the film thickness of the colorant-containing layer made of the blue composition (trade name: SB-5000L) was 0.65 μm.

[Fourth Step]

After the third step, a CMP method (a chemical-mechanical polishing method) was used to remove the red and blue colorant-containing layers on the green filter array and the blue colorant-containing layer on the red filter array. In this case, the method was ended when the green colorant-containing layer was made uncovered.

According to Example 1, a rectangular color filter array having a pattern size of 1.0 μm was able to be formed in the state that the surface of the filter was made flat.

Comparative Example 1

[First Step]

In the same way as in Example 1, a colorant-containing layer made of the green heat-curable composition (trade name: SG-5000L) was formed.

Next, a positive-type photoresist (trade name: FHi622BC, manufactured by FUJIFILM Electronic Materials Co., Ltd.) was applied onto the colorant-containing layer made of the green composition (trade name: SG-5000L) with a device (trade name: Mark 8, manufactured by Tokyo Electron Ltd.), and then the photoresist was pre-baked to form a photoresist layer having a film thickness of 0.8 μm.

Next, an i-line stepper (manufactured by Canon Inc.) was used to radiate the i-line onto photoresist regions other than the region corresponding to a green filter array at 350 mJ/cm$^2$ and subsequently the resultant was heated at 110° C. for 1 minute. Thereafter, the resultant was developed with a developing solution (trade name: FHD-5, manufactured by FUJI-FILM Electronic Materials Co., Ltd.) for 1 minute, and then subjected to post-baking treatment at 120° C. for 2 minutes to remove the photoresist in the regions where the red and blue filter arrays were to be formed. The pattern size at this time was set to 1.0 μm.

Next, in a dry etching machine (trade name: U-621, manufactured by Hitachi High-Technologies Corp.), the workpiece was subjected to etching treatment at an RF power of 800 W, a chamber pressure of 4 Pa, a substrate temperature of 50° C. and an over-etch ratio of 10%, using Ar, $CF_4$ and $O_2$, as gases, having flow rates of 800 mL/min., 200 mL/min., and 50 mL/min., respectively.

Next, a photoresist peeling solution (trade name: MS230C, manufactured by FUJIFILM Electronic Materials Co., Ltd.) was used to conduct peeling treatment for 120 seconds to remove the photoresist. As a result, the workpiece was in a state that the colorant-containing layer made of the green heat-curable composition (trade name: SG-5000L) was formed in the region where the green filter array was to be formed and the underlying substrate was uncovered in the regions where the red and blue filter arrays were to be formed.

[Second Step]

A spin coater was used to apply a red heat-curable composition (trade name: SR-5000L, manufactured by FUJIFILM Electronic Materials Co., Ltd.) onto the substrate undergoing the first step to give a coating film having a film thickness of 0.8 μm in the region where the red filter array was to be formed. Then, a hot plate was used to heat the workpiece at 220° C. for 5 minutes to cure the coating film.

Next, a positive-type photoresist (trade name: FHi622BC, manufactured by FUJIFILM Electronic Materials Co., Ltd.) was applied onto the substrate, and then pre-baked to form a photoresist layer to give a film thickness of 0.8 μm.

Next, an i-line stepper (manufactured by Canon Inc.) was used to radiate the i-line onto the photoresist region corresponding to the blue filter array at 350 mJ/cm$^2$, and subsequently the resultant was heated at 110° C. for 1 minute. Thereafter, the resultant was developed with a developing solution (trade name: FHD-5, manufactured by FUJIFILM Electronic Materials Co., Ltd.) for 1 minute, and then subjected to post-baking treatment at 120° C. for 2 minutes to remove the photoresist in the region where the blue filter array was to be formed. The pattern size at this time was set to 1.0 μm.

Next, in a dry etching machine (trade name: U-621, manufactured by Hitachi High-Technologies Corp.), the workpiece was subjected to etching treatment at an RF power of 800 W, a chamber pressure of 4 Pa, a substrate temperature of 50° C. and an over-etch ratio of 10%, using Ar, $CF_4$ and $O_2$, as gases, having flow rates of 800 mL/min., 200 mL/min., and 50 mL/min., respectively.

Next, a photoresist peeling solution (trade name: MS230C, manufactured by FUJIFILM Electronic Materials Co., Ltd.) was used to conduct peeling treatment for 120 seconds to remove the photoresist. As a result, the workpiece was in a state that the colorant-containing layer made of the green composition (trade name: SG-5000L) and the colorant-containing layer made of the red composition (trade name: SR-5000L) were laminated in the region where the green filter array was to be formed, the colorant-containing layer made of the red composition (trade name: SR-5000L) was formed in the region where the red filter array was to be formed, and the underlying substrate was uncovered in the region where the blue filter array was to be formed.

Next, a positive-type photoresist (trade name: FHi622BC, manufactured by FUJIFILM Electronic Materials Co., Ltd.)

was applied onto the substrate, and then pre-baked to form a photoresist layer to give a film thickness of 0.8 μm.

Next, an i-line stepper (manufactured by Canon Inc.) was used to radiate the i-line onto the photoresist region other than regions corresponding to the blue and red filter arrays at 350 mJ/cm$^2$, and subsequently the resultant was heated at 110° C. for 1 minute. Thereafter, the resultant was developed with a developing solution (trade name: FHD-5, manufactured by FUJIFILM Electronic Materials Co., Ltd.) for 1 minute, and then subjected to post-baking treatment at 120° C. for 2 minutes to remove the photoresist in the region where the green filter array was to be formed. The pattern size at this time was set to 1.0 μm.

Next, in a dry etching machine (trade name: U-621, manufactured by Hitachi High-Technologies Corp.), the workpiece was subjected to etching treatment at an RF power of 800 W, a chamber pressure of 4 Pa, a substrate temperature of 50° C. and an over-etch ratio of 10%, using Ar, $CF_4$ and $O_2$, as gases, having flow rates of 800 mL/min., 200 mL/min., and 50 mL/min., respectively. The etching treatment was ended when the green colorant-containing layer was made uncovered. In this way, the green and red filter arrays were formed.

Next, a photoresist peeling solution (trade name: MS230C, manufactured by FUJIFILM Electronic Materials Co., Ltd.) was used to conduct peeling treatment for 120 seconds to remove the photoresist. As a result, the workpiece was in a state that the colorant-containing layer made of the green composition (trade name: SG-5000L) was formed in the region where the green filter array was to be formed, the colorant-containing layer made of the red composition (trade name: SR-5000L) was formed in the region where the red filter array was to be formed, and the underlying substrate was uncovered in the region where the blue filter array was to be formed.

[Third Step]

A spin coater was used to apply a blue heat-curable composition (trade name: SB-5000L, manufactured by FUJIFILM Electronic Materials Co., Ltd.) onto the substrate undergoing the second step to give a coating film having a film thickness of 0.8 μm in the region where the blue filter array was to be formed, and then a hot plate was used to heat the workpiece at 220° C. for 5 minutes to cure the coating film.

Next, a positive-type photoresist (trade name: FHi622BC, manufactured by FUJIFILM Electronic Materials Co., Ltd.) was applied onto the substrate, and then pre-baked to form a photoresist layer to give a film thickness of 0.8 μm.

Next, an i-line stepper (manufactured by Canon Inc.) was used to radiate the i-line onto the photoresist region other than the region corresponding to the blue filter array at 350 mJ/cm$^2$, and subsequently the resultant was heated at 110° C. for 1 minute. Thereafter, the resultant was developed with a developing solution (trade name: FHD-5, manufactured by FUJIFILM Electronic Materials Co., Ltd.) for 1 minute, and then subjected to post-baking treatment at 120° C. for 2 minutes to remove the photoresist in regions other than the region where the blue filter array was to be formed. The pattern size at this time was set to 1.0 μm.

Next, in a dry etching machine (trade name: U-621, manufactured by Hitachi High-Technologies Corp.), the workpiece was subjected to etching treatment at an RF power of 800 W, a chamber pressure of 4 Pa, a substrate temperature of 50° C. and an over-etch ratio of 10%, using Ar, $CF_4$ and $O_2$, as gases, having flow rates of 800 mL/min., 200 mL/min., and 50 mL/min., respectively. The etching treatment was ended when the green colorant-containing layer was made uncovered.

Next, a photoresist peeling solution (trade name: MS230C, manufactured by FUJIFILM Electronic Materials Co., Ltd.) was used to conduct peeling treatment for 120 seconds to remove the photoresist. As a result, a color filter array having a pattern size of 1.0 μm was able to be formed. However, the film thicknesses of the individual colorant-containing layers were unable to be made even.

According to the invention, it is possible to provide a color filter producing method using a dry etching process and making it possible to produce a color filter which has fine and rectangular pixels and is excellent in flatness.

According to exemplary embodiments of the invention, there are provided:

<1> A method for producing a color filter, comprising: a first colorant-containing layer forming step (a) of forming a first colorant-containing layer over a support; a photoresist layer forming step (b) of forming a photoresist layer on the first colorant-containing layer; an image forming step (c) of removing the photoresist layer in a region where a second colorant-containing layer different from the first colorant-containing layer is to be formed over the support, thereby forming an image on the first colorant-containing layer, an etching step (d) of etching the first colorant-containing layer in the region into the form of the image formed in the image forming step by dry etching, a photoresist layer removing step (e) of removing the photoresist layer remaining after the etching step, and a second colorant-containing layer forming step (f) of forming the second colorant-containing layer at least in the region where the first colorant-containing layer has been removed.

<2> The method for producing a color filter of item <1>, wherein the second colorant-containing layer forming step is a step of supplying a colorant-containing heat-curable composition to the region where the first colorant-containing layer has been removed, thereby forming the second colorant-containing layer.

<3> The method for producing a color filter of item <2>, wherein the supplying of the colorant-containing heat-curable composition is performed by application.

<4> The method for producing a color filter of any one of items <1> to <3>, wherein steps (b) to (f) are carried out successively at least two times.

<5> The method for producing a color filter of any one of items <1> to <4>, which further comprises a step of removing the colorant-containing layer portion laminated over the colorant-containing layer which is nearest to the support among the two colorant-containing layers and any optional colorant-containing layers laminated over the support.

<6> The method for producing a color filter of item <5>, wherein the step of removing the colorant-containing layer portion laminated over the colorant-containing layer which is nearest to the support among the two colorant-containing layers and any optional colorant-containing layers laminated over the support is a chemical-mechanical polishing step.

<7> A color filter produced by the color filter producing method of any one of items <1> to <6>

All publications, patent applications, and technical standards mentioned in this specification are herein incorporated by reference to the same extent as if such individual publication, patent application, or technical standard was specifically and individually indicated to be incorporated by reference.

It will be obvious to those having skill in the art that many changes may be made in the above-described details of the preferred embodiments of the present invention. The scope of the invention, therefore, should be determined by the following claims.

What is claimed is:

1. A method for producing a color filter, comprising:
a first colorant-containing layer forming step of forming a first colorant-containing layer over a support;
a first photoresist layer forming step of forming a first photoresist layer on the first colorant-containing layer;
a first image forming step of removing the first photoresist layer in a first region, thereby forming a first image on the first colorant-containing layer;
a first etching step of etching the first colorant-containing layer in the first region into the form of the first image formed in the first image forming step by dry etching, to form a first concave region in the first colorant-containing layer;
a first photoresist layer removing step of removing the first photoresist layer remaining after the first etching step;
a second colorant-containing layer forming step of forming a second colorant-containing layer different from the first colorant-containing layer over the first concave region formed in the first colorant-containing layer and also over remaining portions of the first colorant-containing layer, wherein the second colorant-containing layer is formed by embedding a curable composition into the first concave formed in the first colorant-containing layer;
a second photoresist layer forming step of forming a second photoresist layer over the second colorant-containing layer;
a second image forming step of removing the second photoresist layer in a second region;
a second etching step of etching both the second colorant-containing layer and the first colorant-containing layer in the second region during the second etching step, thereby forming a second concave region at which the support is exposed;
a second photoresist removing step to remove the second photoresist layer remaining after the second etching step;
a third colorant-containing layer forming step of forming a third colorant-containing layer different from the first and second colorant containing layers in at least the second concave region; and
a step of removing colorant-containing layers to leave only a colorant-containing layer nearest to the support, thereby providing a color filter,
wherein the color filter has the first region formed from the second colorant-containing layer and the second region formed from the third colorant-containing layer,
wherein the first and second concave regions do not overlap each other.

2. The method for producing a color filter of claim 1, wherein the second colorant-containing layer forming step is a step of supplying a colorant-containing heat-curable composition into the first concave region formed in the first colorant-containing layer and also over remaining portions of the first colorant-containing layer, thereby forming the second colorant-containing layer.

3. The method for producing a color filter of claim 2, wherein the supplying of the colorant-containing heat-curable composition is performed by application.

4. The method for producing a color filter of claim 1, wherein the step of removing colorant-containing layers is a chemical-mechanical polishing step.

* * * * *